United States Patent
Konopka

(10) Patent No.: US 12,362,582 B2
(45) Date of Patent: Jul. 15, 2025

(54) SYSTEMS AND METHODS FOR HARMONIC-BASED BATTERY CHARGING

(71) Applicant: Iontra Inc, Centennial, CO (US)

(72) Inventor: Daniel A. Konopka, Denver, CO (US)

(73) Assignee: Iontra Inc, Centennial, CO (US)

( * ) Notice: Subject to any disclaimer, the term of this patent is extended or adjusted under 35 U.S.C. 154(b) by 761 days.

(21) Appl. No.: 17/473,828

(22) Filed: Sep. 13, 2021

(65) Prior Publication Data

US 2022/0085633 A1   Mar. 17, 2022

Related U.S. Application Data

(60) Provisional application No. 63/077,331, filed on Sep. 11, 2020.

(51) Int. Cl.
*H02J 7/00* (2006.01)

(52) U.S. Cl.
CPC ....... *H02J 7/00711* (2020.01); *H02J 7/00714* (2020.01); *H02J 7/007182* (2020.01)

(58) Field of Classification Search
USPC ......................................................... 320/139
See application file for complete search history.

(56) References Cited

U.S. PATENT DOCUMENTS

| | | | |
|---|---|---|---|
| 8,150,643 B1 | 4/2012 | Morrison et al. | |
| 2008/0303528 A1* | 12/2008 | Kim | G01R 31/385 324/430 |
| 2019/0072618 A1* | 3/2019 | Ghantous | H02J 7/005 |
| 2020/0363476 A1* | 11/2020 | Liu | H02J 7/00 |

OTHER PUBLICATIONS

International Searching Authority, Transmittal of International Search Report and Written Opinion, issue for PCT/US2021/050115, mailed Dec. 24, 2021.

\* cited by examiner

*Primary Examiner* — Samuel Berhanu
(74) *Attorney, Agent, or Firm* — Polsinelli PC; Gregory P. Durbin

(57) ABSTRACT

Aspects of the present disclosure involve charging or discharging an electrochemical device such as a battery. The system generates a waveform, such as a charge signal, to tune harmonic attributes of the waveform based on the impedance of the battery to a harmonic or harmonics of the waveform. The system may enhance (e.g., add or increase magnitude) or suppress (e.g., delete or reduce magnitude) harmonics of the waveform. Such a harmonically tuned waveform may optimize energy transfer to or from the battery to achieve various possible goals including charging speed, enhancing battery charge capacity and/or enhancing battery cycle life.

18 Claims, 16 Drawing Sheets

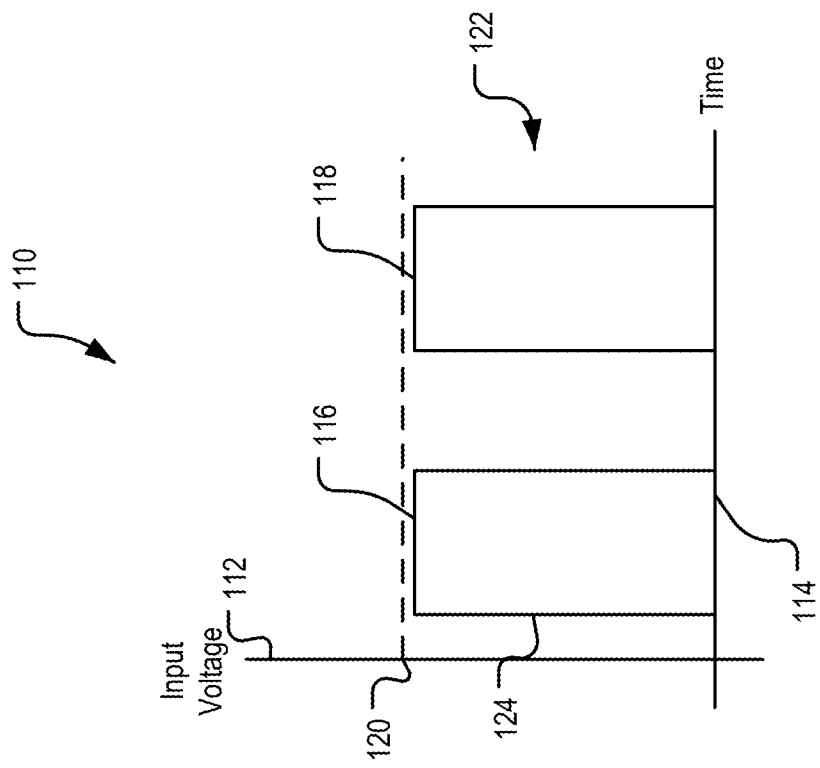
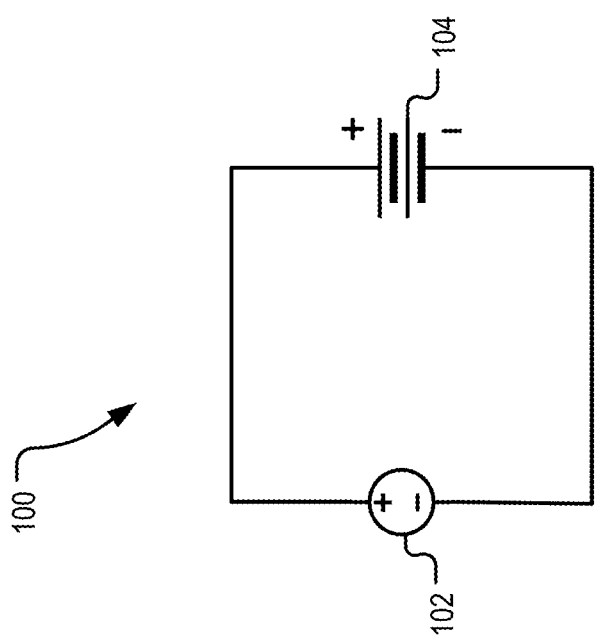
FIG. 1B
(Prior Art)
FIG. 1A

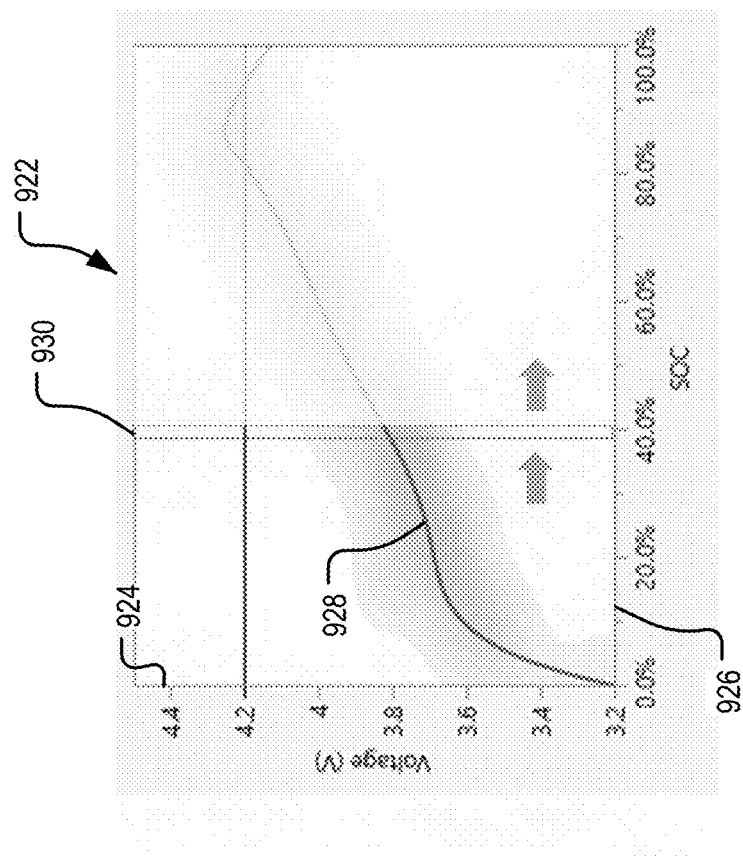
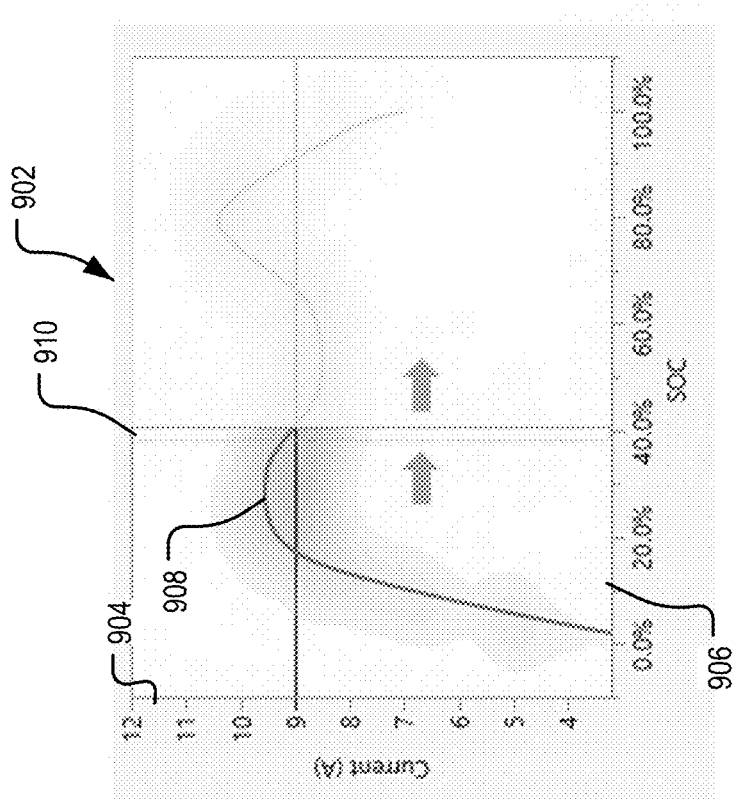
FIG. 9B
FIG. 9A

SYSTEMS AND METHODS FOR HARMONIC-BASED BATTERY CHARGING

CROSS-REFERENCE TO RELATED APPLICATION

This application is related to and claims priority under 35 U.S.C. § 119(e) from U.S. Patent Application No. 63/077,331 filed Sep. 11, 2020 entitled "SYSTEMS AND METHODS FOR HARMONIC-BASED BATTERY CELL CHARGING," the entire contents of which is incorporated herein by reference for all purposes.

TECHNICAL FIELD

Embodiments of the present invention generally relate to systems and methods for charging or drawing energy (discharging) a battery, and more specifically for a generation of an optimal signal to or from the battery through harmonic tuning of the harmonic components of the signal.

BACKGROUND AND INTRODUCTION

Many electrically-powered devices, such as power tools, vacuums, any number of different portable electronic devices, and electric vehicles of all types, use rechargeable batteries as a source of operating power. Rechargeable batteries are limited by finite battery capacity and must be recharged upon depletion. Recharging a battery may be inconvenient as the powered device must often be stationary during the time required for recharging the battery. In the case of vehicles, recharging can take hours. As such, significant effort has been put into developing rapid charging technology to reduce the time needed to recharge the battery. However, rapid recharging systems are typically inefficient while lower rate recharging systems prolong the recharging operation, undermining the basic objective of a quick return to service.

At perhaps the simplest level, shown in FIG. 1A, battery charging involves applying a DC charge current to a battery cell. Various battery types, however, can only accept so much current before damaging the cells. FIG. 1A illustrates a schematic of a simple circuit 100 for recharging a single cell battery. Other components of the circuit, such as a current meter volt-meter, controller, etc., are not illustrated. The application of the power signal to the electrodes of the battery cell 104 causes a reverse flow of electrons through the battery to replenish the stored concentration of charge carriers (such as lithium ions) at the anode. In one particular example, the power source 102 may be a direct current (DC) voltage source to provide a DC charge current to the battery cell 104. Other types of power sources, such as a current controlled source, may also be used.

The various implementation discussed herein involving charging and discharging are applicable to electrochemical devices such as batteries. The term "battery" in the art can be used in various ways and may refer to an individual cell having an anode and cathode separated by an electrolyte as well as a collection of such cells connected in various arrangements. Batteries generally comprise repeating units of sources of a countercharge and first electrode layers separated by an ionically conductive barrier, often a liquid or polymer membrane saturated with an electrolyte. These layers are made to be thin so multiple units can occupy the volume of a battery, increasing the available power of the battery with each stacked unit. Although many examples are discussed herein as applicable to a battery, a cell or a battery cell, it should be appreciated that the systems and methods described may apply to many different type of cells, as well as batteries involving different possible interconnections of cells such as cells coupled in parallel, series, and parallel and series. For example, the systems and methods discussed herein may apply to a battery pack comprising numerous cells arranged to provide a defined pack voltage, output current, and/or capacity. Moreover, the implementations discussed herein may apply to different types of electrochemical devices such as various different types of lithium batteries including but not limited to lithium-metal and lithium-ion batteries, lead acid batteries, various types of nickel batteries, and solid state batteries, to name a few. The various implementations discussed herein may also apply to different structural battery arrangements such as button or "coin" type batteries, cylindrical cells, pouch cells, and prismatic cells.

In exploring the effect of charge and discharge signals on a battery and the effects of pulse charging on a battery, which is sometimes used in so-called fast charging situations, various problems have been discovered. FIG. 1B illustrates a graph 110 of a prior art direct current voltage signal 122 produced by the power source 102 and applied to the battery cell 104 to recharge the battery. The graph illustrates an input voltage 112 versus time 114 of the charge signal 122. In general, the power source 102 may be controlled to provide a repeating pulse 122 to the electrodes of the battery cell 104 to recharge the battery cell. In particular, the power source 102 may be controlled to provide a repeating square-wave (illustrated as pulse 116 followed by pulse 118) signal to the battery cell 104. The peaks of the square-wave pulses 116, 118 may be less than or equal to a voltage threshold value 120 corresponding to operational constraints of the voltage source 102. A typical charge signal used to recharge a battery cell 104 may apply a charging signal during a charging period, with a rest period of some duration between application of the charging signal. The operation of the circuit 100 in this manner generates the illustrated power recharge signal 122 of FIG. 1B of a repeating square-wave pattern.

In some instances, however, applying a square-wave charge signal 122 to recharge a battery cell 104 may degrade the life of the battery cell under recharge or may introduce inefficiencies in the recharging of the battery. For example, the abrupt application of charge current (i.e., the sharp leading edge 124 of the square-wave pulse 116) to the electrode (typically the anode) of the battery cell 104 may cause a large initial impedance across the battery terminals. In particular, FIG. 10 illustrates a graph of estimated real impedance values of a battery cell 104 to corresponding frequencies of a recharge signal applied to the battery cell in accordance with one embodiment. In particular, the graph 150 illustrates a plot of real impedance values (axis 154) versus a logarithmic frequency axis (axis 152) of frequencies of an input signal to the battery cell 104. The plot 150 illustrates real impedance values across the electrodes of a battery cell 104 at the various frequencies of a recharge power signal used to recharge a battery. The shape and measured values of the plot 150 may vary based on battery type, state of charge of the battery, operational constraints of the battery, heat of the battery, and the like. However, a general understanding of the characteristics of a battery under charge may be obtained from the plot 158. In particular, real impedance values experienced at the electrodes of the battery cell 104 may vary based on the frequency of the power charge signal provided to the battery, with a general sharp increase in real impedance values 328 at high frequencies. For example, an input power signal to the battery cell 104 at frequency $f_{Sq}$ 162 may introduce a high real impedance 160 at the battery cell 104 electrodes, which may lessen the efficiency of the charging process and/or damage portions of the battery cell under charge.

Returning to the square-wave charge signal 122 of FIG. 1B, large frequencies of the signal may be present at the corners of the square-wave pulse 116. In particular, the rapid changes in the charge signal (such as the leading edge 124 of the pulse 116) to the battery cell 104 may introduce noise comprised of high-frequency harmonics, such as at the leading edge of the square-wave pulse, the tail edge of the square-way pulse, and during use of conventional reverse pulse schemes. As shown in the graph 150 of FIG. 10, such high harmonics result in a large impedance at the battery electrodes. This high impedance may result in many inefficiencies, including capacity losses, heat generation, and imbalance in electro-kinetic activity throughout the battery cell, undesirable electro-chemical response at the charge boundary, and degradation to the materials within the battery cell 104 that may damage the battery and degrade the life of the battery cell. Further, cold starting a battery with a fast pulse introduces limited faradaic activity as capacitive charging and diffusive processes set in. During this time, proximal lithium will react and be quickly consumed, leaving a period of unwanted side reactions and diffusion-limited conditions which negatively impact the health of the cell and its components. These and other inefficiencies are particularly detrimental during a fast recharging of the battery cell 104 where relatively higher currents are often involved.

It is with these observations in mind, among others, that various aspects of the present disclosure were conceived.

SUMMARY

In one aspect, a method of managing charging or discharging an electrochemical device comprises transforming, using a processor, a waveform to identify at least one harmonic component of the waveform. The system alters a harmonic component of the transformed waveform. The method further involves inverse transforming the waveform to generate a harmonically tuned waveform based on the altering of the harmonic component.

In another aspect, a method of charging (discharging) an electrochemical device comprising applying, to a waveform associated with an electrochemical device, a wavelet to identify a harmonic component of the waveform. The method further involves identifying an effect of the identified harmonic component and altering, based on the identified effect, the harmonic component of the waveform.

In another aspect, a system for generating a waveform for an electrochemical device, comprises a computing element to generate a harmonically tuned waveform with a harmonic attribute of the charge (or discharge) signal based on the impedance of a battery to a harmonic associated with the harmonic attribute.

These and other aspects of the present disclosure are described in further detail below.

BRIEF DESCRIPTION OF THE DRAWINGS

FIG. 10 is a graph of estimated real impedance values of a battery cell to corresponding frequencies of a charge signal applied to the battery cell in accordance with one embodiment.

FIGS. 9A and 9B are signal graphs of a current charge profile and a voltage charge profile for charging a battery cell in accordance with one embodiment.

DETAILED DESCRIPTION

Figure 1C:
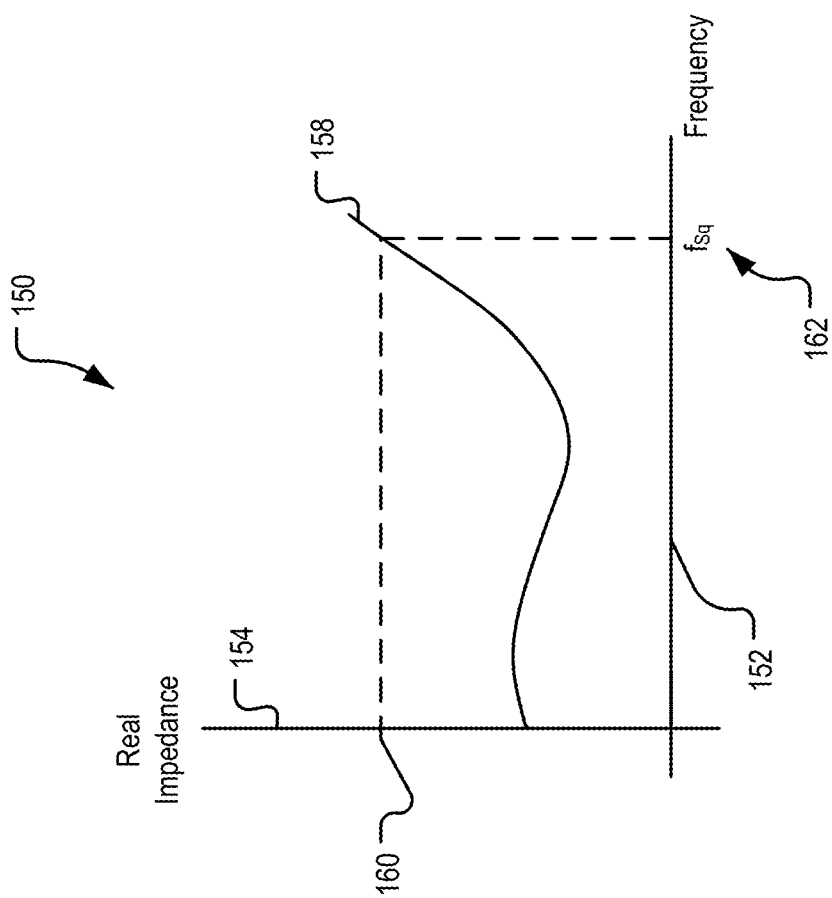
FIG. 1A is a schematic for a prior art circuit for charging a battery cell.
FIG. 1B is a signal diagram of a prior art direct current voltage or current signal for recharging a battery cell.

Systems, circuits, and methods are disclosed herein for charging (recharging) or discharging a battery. The terms charging and recharging are used synonymously herein. Through the systems, circuits, and methods discussed, less energy may be required to charge a battery cell than through previous charging circuits and methods. Aspects of the present disclosure may provide several advantages, alone or in combination, relative to conventional charging. For example, the charging techniques described herein may reduce the rate at which an anode is damaged, may reduce heat generated during charging, which may have several follow-on effects such as reducing anode and cell damage, reducing fire or short circuit risks, and the like. In other examples, the charging techniques described herein may allow for higher charging rates to be applied to a cell and may thus allow for faster charging. The techniques may all optimum charge rates to be used, and which consider other issues such as cycle life and temperature. In one example, charge rates and parameters may be optimized to provide for a longer cell life and greater charging energy efficiency. In another example, in what might be considered "fast charging," the disclosed systems and methods provide an improved balance of charge rate and cell life, while producing less heat. While previous charging circuits have attempted to address the efficiency of the charging circuits by focusing on the electronic devices of the charging circuits, the disclosed systems, circuits, and methods provide an efficient battery charge signal when applied to charge a battery cell.

The various embodiments discussed herein may charge or discharge a battery by generating an energy transfer signal that corresponds to a harmonic (or harmonics) associated with an optimal transfer of energy based on a real and/or an imaginary impedance representation of the energy transfer to or from of the battery. In one example, the charge signal is composed of one or more harmonic components selected based on their effective impedance. The system may generate the signal such that it includes the harmonic component. The system may amplify specific harmonic components, may filter or suppress harmonic components, may shift harmonic components and otherwise control the make-up of the charge signal focusing on the harmonic components of the signal and the effect of those harmonics on energy transfer to or from the battery. Impedance, like resistance, in the context of battery charging and discharging, is the measure of opposition to energy transfer, e.g., current, to and from the battery. Unlike resistance, impedance also considers the effect of frequency on the opposition to energy transfer. In some discussions herein, the systems assess the impedance effect of harmonic components of charge signal on energy transfer to and from a battery. In one example, the harmonic may be associated with a minimum impedance value of the battery cell. In other examples, considerations besides lowering impedance may be considered. In another example, the harmonic of the charge signal corresponds to a harmonic associated with both the real and imaginary impedance value of the cell. In still another example, the charge signal may be comprised of harmonics associated with one or both of a conductance or susceptance of an admittance of the battery cell. In other various embodiments, a charge signal for a battery cell may be altered to remove harmonics corresponding to a high impedance or conversely low admittance of the battery cell. As such, other measures may also be used, such as admittance or its components of susceptance and conductance with impedance being used in the discussed examples. The term impedance as used herein may include its inverse admittance.

More particularly, systems and circuits are described that determine a harmonic profile of a battery charge signal. For ease of discussion the term charge signal is primarily used herein but the concepts encompass discharge and hence more generally energy transfer. A harmonic profile identifies one or more harmonic components of a charge signal and may further identify the impedance effect of any given harmonic. The harmonic profile may be associated with various possible attributes of the battery such as temperature, state of charge, battery type and the like. Thus, in some examples, since the harmonic profile of the charge signal may change due to state of charge, temperature, and other factors of the battery, the techniques discussed herein may assess or otherwise determine, periodically or otherwise, the harmonic profile of the charge signal during a charging session. Further, one or more control circuits may shape, alter, or generate a charge signal (e.g., charge current) corresponding to the determined harmonic profile of the charge signal. In one instance, the control circuits may enhance portions of the charge signal associated with a harmonic or harmonics corresponding to a minimum impedance value. Stated differently, the system may generate a charge signal enhancing and otherwise emphasizing harmonic components that more efficiently transfer energy to the battery. In other instances, the control circuits may decrease portions of the charge signal associated with a harmonic or harmonics corresponding to a relatively large impedance value or harmonics corresponding to negative chemical or physical reactions (generally characteristics) occurring within the battery cell. Stated differently, the system may generate a charge signal suppressing and otherwise deemphasizing harmonic components that more oppose transfer of energy to the battery or otherwise are associated with various deleterious characteristics and effects. Of course, the system may be arranged to provide a charge signal that both enhances some harmonic components and suppresses other harmonic components. As introduced above, the state of charge and temperature may fluctuate during recharging such that the harmonic profile of a charge signal may change due to the changes in material properties, chemical, and electro-chemical processes within the battery. The circuits described herein may, in some instances, perform an iterative process of monitoring or determining a harmonic profile of the charge signal of the battery and adjusting the charge signal applied to the battery based on the harmonic profile. This iterative process may improve the efficiency of the charge signal used to recharge the battery, thereby decreasing the time to recharge the battery, extending the life of the battery (e.g., the number of charge and discharge cycles it may experience), optimizing the amount of current charging the battery, manage temperature of the battery, and avoiding energy lost to various inefficiencies, among other advantages.

To generate the charge signal for the battery with an appropriate harmonic component, a battery charge circuit may include one or more charge signal defining circuits and an impedance measurement circuit, including both hardware components and/or software components, and/or application specific integrated circuits. In one particular example, hundreds or thousands of measurements of a voltage and current portion of the charge signal may be obtained and analyzed via a digital processing system or other similar system to alter the character of the signal charging the battery cell. In another example, aspects of the charge signal may be analyzed via a domain transformation between time and frequency. The charge signal may be controlled or adjusted based on the domain transformation, impedance understanding of one or more harmonic components of the charge signal identified in the domain transformation, and inverse transformation in a feedback loop control of the charge signal. For example, portions of a charge signal, such as low magnitude periods among neighboring high magnitude periods of the signal, including edge or bulk portions of dominant harmonics may be adjusted based on transformation and analysis of the charge signal. In another example, harmonic components, identified in the domain transformation, may be enhanced or suppressed in the inverse transformation based on impedance of the identified harmonic components.

In one particular example, charge signals for voltage and current (in real or near real time, or for a single period or multiple, averaged periods of a defined measurement time frame) may be measured in the time domain. A transform may be used to convert the measured time domain data to corresponding data in the frequency domain. In some instances, the type of transformation used may depend upon the character of the data, such as stationary/non-stationary or periodic/aperiodic, the format and content of the data such as the type of noise and signal to noise ratio in the data, or processor capabilities of a circuit controller or digital processing system. At a high level, by transforming the charge signal data into the frequency domain, the magnitudes of individual harmonics within the charge signal may be determined and manipulated to optimize a charge signal resulting from analysis of the charge signal in the frequency domain. In particular, harmonics obtained from the transform of the charge signal may be analyzed, comparing voltage and current, to determine the independent contribution of each to impedance, power, peak voltage and/or current at a battery cell under charge. For example, harmonics with relatively high impedance at the battery cell may be eliminated, suppressed (e.g., magnitude reduced) or shifted while others may be increased to produce a charge signal composed from an optimized combination of harmonics. In some instances, the optimized charge signal may be defined, at least in part, from the harmonic manipulation being inversely transformed back from the frequency domain into the time domain, yielding the optimized (new) charge signal or a definition of the same, which may be generated by charge circuitry discussed herein. The altered harmonic attributes of the optimized charge signal may be associated with a relatively lower impedance along with various attendant benefits to the cell and/or may improve other battery cell characteristics.

In some instances, gating may be performed on the time domain charge signal to independently analyze windows of the charge signal, with the system performing a domain transform against the window, harmonic tuning, and then inversely transforming and rejoining sections to produce an improved, harmonically tuned, form of the complete charge signal. The process of gating, which also may be referred to as windowing, may involve analyzing discrete portions of the signal. Stated differently, the process of gating the transformed charge signal may include transforming only a portion of the time domain data to the frequency domain for analysis of the portion. For example, the charge signal may be processed by several different bandpass filters and each band independently evaluated along with or in lieu of whole wave analysis. This may be useful when sections of the wave are heavily multi-modal in magnitude or harmonic content. This may also allow for separate analysis of harmonic content occurring at different orders of time, or separation of closely positioned harmonics. Gating allows analysis of discrete periods of time without influence from signal behaviors before or after the period of focus of the window. The gating process may allow an analysis of higher frequencies that occur at smaller intervals within the charge signal that may not be obtained when the entire charge signal is transformed. Depending on the charge signal, the gating process may provide for more discrete signal analysis, which alone or in combinations, may inform the charge signal optimization processes discussed herein, and thus may be may be useful in analyzing or defining a charge signal to modify oscillatory behaviors that can occur in the charge signal due to the impedance of the battery cell to the charge signal, heat flux, charge and mass transport phenomena, environmental noise, or cell balancing within a battery pack.

Through the systems and methods described herein, a harmonically tuned and prescribed, transient charge signal may be applied to a battery through control of the circuit to deliver an optimized amount and timing of power to the battery which may involve adding and/or enhancing some harmonic components of the signal and concurrently reducing or removing sub-optimal harmonics from the signal. This tuned signal therefore controls the impedance across the interface within the battery, including the electrodes, during charge or discharge of the battery. When control involves reducing the impedance, the energy transfer efficiency may be improved and the speed of the charging may be approved. As noted, however, controlling harmonic content based on impedance is not necessarily based on controlling to the lowest impedance possible and is not necessarily based on only controlling for speed of charge and reducing opposition to energy charge. For example, in certain phases of charging, it may be desirable to effect other attributes of a battery through control of harmonics and understanding how impedance may affect other attributes, such as temperature.

Figure 2:
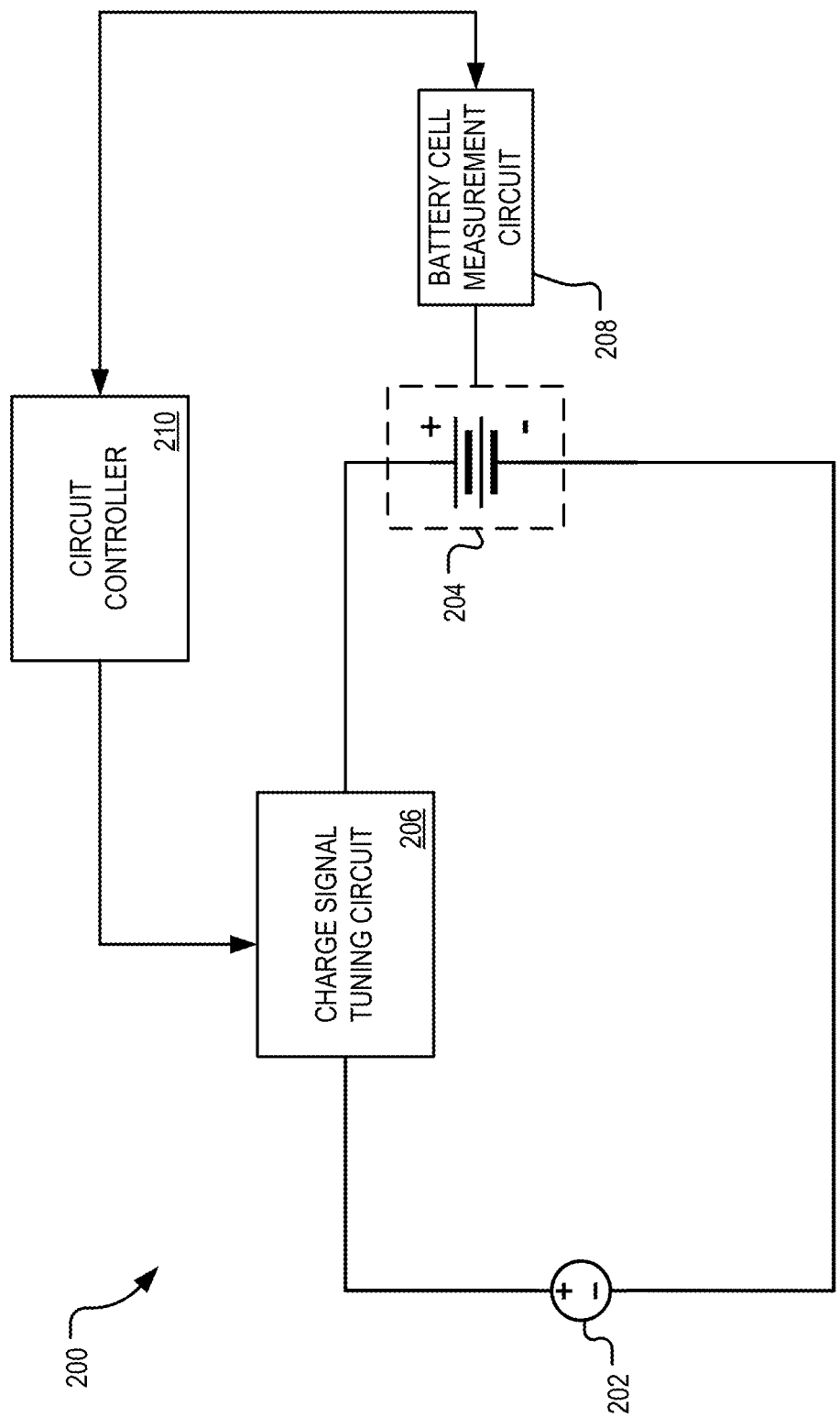
FIG. 2 is a schematic diagram illustrating a circuit for charging a battery cell utilizing a charge signal shaping circuit in accordance with one embodiment.

FIG. 2 is a schematic diagram illustrating an example circuit 200 for charging a battery cell 204 utilizing a charge signal shaping circuit 206 and an impedance measurement circuit 208 in accordance with one embodiment. In the discussion of FIG. 2, a cell is referenced but it should be understood that the discussion pertains more generally to a battery, with a cell being a discrete example of the same. In general, the circuit 200 may include a power source 202, which may be a voltage source or a current source. In one particular embodiment, the power source 202 is a direct current (DC) voltage source, although alternating current (AC) sources are also contemplated. More particularly, the power source 202 may include a DC source providing a unidirectional current, an AC source providing a bidirectional current, or a power source providing a ripple current (such as an AC signal with a DC bias to cause the current to be unidirectional. In general, the power source 202 supplies the charge current that may be shaped and used to charge the battery cell 204. In one particular implementation, the circuit 200 of FIG. 2 may include a charge signal shaping circuit 206 to shape one or more aspects of a charge signal for use in charging the battery cell 204. In one example, a circuit controller 210 may provide one or more inputs to the power signal shaping circuit 206 to control the shaping of the charge signal. The inputs may be used by the shaping circuit 206 to alter a signal from the power source 202 into a more efficient power charging signal for the battery cell 204. The operation and composition of the charge signal shaping circuit 206 is described in more detail below.

In some instances, the charge signal shaping circuit 206 may alter energy from the power source 202 to generate a charge signal that is based, at least in part, on the impedance effect on the battery of harmonic components of the charge signal. The charge signal may be altered to enhance harmonics and/or suppress harmonics to control the impedance of the battery to the charge signal. In some examples, the system may manipulate the harmonic content of the charge signal to reduce and/or minimize the impedance of the battery to the charge signal. It is also possible to characterize a cell such that impedance may be known at any given charge current, voltage level, charge level, number of charge/discharge cycles, and/or temperature among other factors, such that impedance is not directly measured but instead looked-up (or otherwise accessed) from memory, or the like. In another example, a charge signal may be tailored to various conditions such as battery type, open circuit voltage, state of charge, number of cycles, temperature, and the like to set a charge profile, which will include one or more harmonic attributes with some established effect on impedance. The charge profile may be an initial charge profile that is then altered in response to impedance assessments and/or altered based on other measured attributes, besides impedance, with some preestablished effect on impedance.

In one example, the circuit 200 may include a battery cell measurement circuit 208 connected to the battery cell 204 to measure cell voltage and charge current, as well as other cell attributes like temperature, and measure or calculate the cell's impedance to the charge signal. In one example, battery cell characteristics may be measured based on the applied charge signal. In another example, battery cell characteristics may be measured as part of a routine that applies a signal with varying harmonic attributes to generate a range of battery cell characteristic values associated with the different harmonic attributes to characterize the cell, which may be done prior to charging, during charging, periodically during charging, and may be used in combination with look-up techniques, and other techniques. The measurement circuit may obtain battery characteristics through previous characterization of the battery, current measurements of the battery or conditions associated with the battery, and combinations of the same. The battery cell 204 characteristics may vary based on many physical or chemical features of the cell, including a state of charge and/or a temperature of the cell. As such, the battery cell measurement circuit 208 may be controlled by the circuit controller 210 to obtain various battery cell characteristic values of the battery cell 204 during charging of the cell, among other times, and provide the battery cell characteristic values to the circuit controller 210.

In some instances, a component of impedance, such as real and/or imaginary components, of the battery cell 204 may be provided to the charge signal tuning circuit 206 by the circuit controller such that energy from the power source 202 defines a charge signal with a harmonic component or components defined based on the effect of the harmonic on the impedance (e.g., a harmonic at or around the minimum impedance) or other effect on the battery cell. In another example, the circuit controller 210 may generate one or more control signals based on the battery cell characteristic values and provide those control signals to the charge signal tuning circuit 206. The control signals may, among other functions, define the charge signal to include a harmonic component corresponding to the impedance value, increase a magnitude of a harmonic portion of the charge signal corresponding to a relatively low real impedance value, and/or decrease a magnitude of a harmonic portion of the charge signal corresponding to a relatively high impedance value. In some instances, new harmonics may be added and/or harmonics may be eliminated completely. In other instances, a harmonic may be shifted in frequency and/or time, with the new frequency or time having a different impedance response at the cell. In still other examples and as mentioned above, the charge signal tuning circuit 206 may alter energy from the power source 202 to generate a charge signal that at least partially corresponds to a harmonic associated with a conductance or susceptance component of an admittance of the battery cell 204 or any other aspect related to an impedance at the battery cell. Thus, although described herein as pertaining to a real or imaginary component of impedance, the systems and methods may similarly measure or consider other attributes of the battery cell, such as a conductance component or susceptance component of an admittance of the battery cell. One particular implementation of the charge tuning circuit 106 is described in greater detail in U.S. application Ser. No. 17/232,975 titled "Systems and Methods for Battery Charging," filed Apr. 16, 2021, the entirety of which is incorporated by reference herein.

Figure 3:
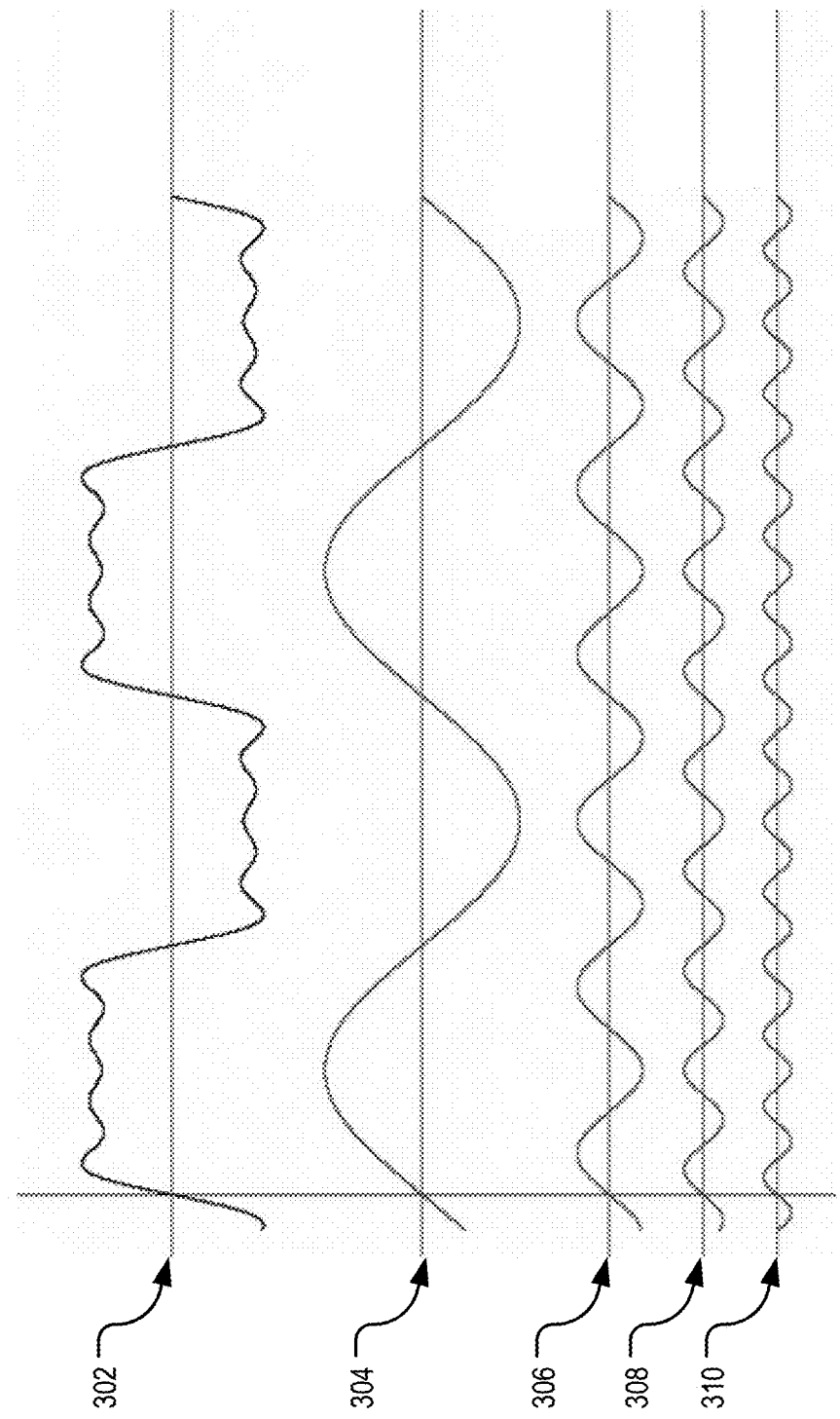
FIG. 3 is a signal diagram of a charge signal for a battery cell and the component harmonics of the charge signal in accordance with one embodiment.

FIG. 3 illustrates an example charge waveform 302, which could be applied to charge a battery cell 204. The composite waveform signal 302 may be understood to be comprised of multiple sinusoidal signals, or harmonics, of different frequencies. While the composite signal 302 in this fairly simple example is in the form of a series of pulses, charge signals herein may be of any shape or series of shaped and otherwise arbitrarily shaped when viewed in the time domain. In the illustrated example, the waveform signal 302 is a summation of sinusoidal signal 304 of a first frequency, sinusoidal signal 306 of a second frequency, sinusoidal signal 308 of a third frequency, and sinusoidal signal 310 of a fourth frequency. In any given situation, more or less harmonic components are possible, and the example of four is used merely for purposes of illustration and example. The combination of the sinusoidal harmonics 304-310 comprise the waveform signal 302 of FIG. 3. Aspects of the present disclosure involve controlling the harmonic content of a charging signal, including presence or absence of certain harmonics, magnitude and timing of harmonics, and using that signal to charge a battery cell. In some instance, various aspects of the waveforms, e.g., a localized rising edge, harmonic content of a continuous portion, and/or a localized falling edge, may be created through a harmonic or combination of harmonic components. In other instances, magnitudes of various harmonic components of the charge signal may be adjusted based on a harmonic analysis of the charge signal. As explained above, the impedance at a battery cell 204 due to the application of a charge signal 202 may be dependent upon the harmonics or frequencies contained within the charge signal. Moreover, the uncontrolled implicit harmonics of a charge waveform, such as those generated by a power supply, may be associated with relatively high impedances at the battery cell 204, lowering the efficiency of the waveform to charge the battery cell 204. As such, controlling the harmonic content of a charge signal waveform to remove or diminish harmonics at which high impedance is present at the battery cell 204, and/or enhance harmonics at which impedance is low, may improve the efficiency in charging the battery, reduce heat generated during charging, reduce damage to the anode or cathode, reduce charging time, allow for more capacity to be used, and/or increase battery life.

Figure 4:
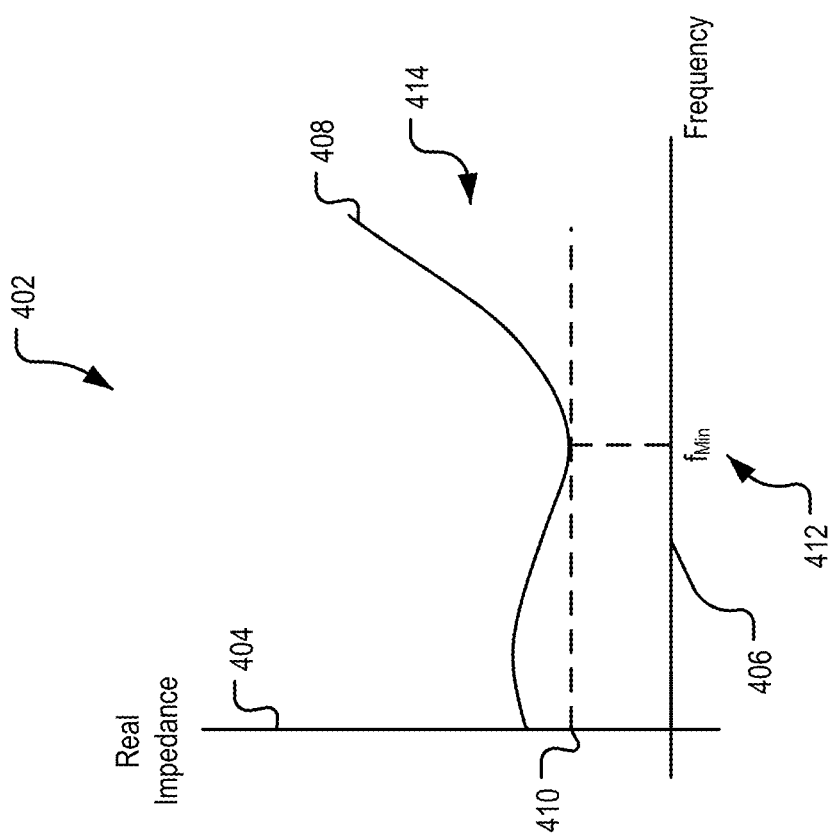
FIG. 4 is a graph of measured real impedance values of a battery cell to corresponding frequencies of a charge signal applied to the battery cell in accordance with one embodiment.

To further illustrate this point, FIG. 4 is a graph 402 illustrating a representative relationship between a real impedance value (axis 404) of a battery cell 204 to corresponding harmonics (illustrated as logarithmic frequency axis (axis 406)) included in a charge signal applied to the battery cell. The plot 408 illustrates example real impedance values across the electrodes of a battery cell 204 at the various frequencies of harmonic components of a charge signal waveform that may applied to a battery cell 204. As shown, the real impedance values 408 may vary based on the frequency of harmonic components of the charge signal, with relatively lower impedances between initially higher impedances at lower frequencies and then a relatively rapid increase in real impedance values at harmonics higher than the frequency at which the lowest impedance is found. The complex impedance may follow a similar plot. The plot 408 of real impedance values for the battery cell 204 indicates a minimum real impedance value 410 that corresponds to a particular charge signal frequency 412 attribute, labeled as $f_{Min}$. The attribute may be the frequency of a harmonic component of the charge signal, as well as a discrete rising edge of the charge signal and/or falling edge of the charge signal, which may rise or fall commensurate with, for example, the shape of a rising or falling edge of sinusoidal signal at the frequency. The plot of real impedance values 408 for the battery cell 204 may be dependent on many factors of the cell, such as battery chemistry, state of charge, temperature, composition of charge signal, and the like. Thus, the frequency $f_{Min}$ 412 corresponding to the minimum real impedance value 410 of the battery cell 204 may similarly be dependent upon the characteristics of the particular battery cell under charge. The frequency $f_{Min}$ 412 may correspond to other aspects of the battery cell 204, such as the configuration of the cells in a pack and the connections between the cells in the pack.

As the charging of the battery 204 may be more efficient at the or near the frequency $f_{Min}$ 412 due to the lower impedance of the battery cell at that frequency harmonic, the circuit controller 210 may utilize the charge signal shaping circuit 206 to define harmonic and/or other frequency attributes of a charge signal for a battery cell. However, as described above, a charge waveform may include any number of harmonic components. Some harmonic components of the charge waveform may be at or near frequency $f_{Min}$ 412 such that the power provided by that component may charge the battery cell 204 efficiently. Other harmonic components, however, may provide an inefficient charging of the battery cell 204 and/or may damage chemical or physical properties of the battery cell, or cause other undesirable affects such as heat. To address any or all of these various inefficiencies or affects, among others, the circuit controller 210 may, in some instances, control the charge signal tuning circuit 206 to enhance components of the charge signal at efficient harmonics and/or suppress or eliminate components of the charge signal at inefficient or harmful harmonics.

Figure 5:
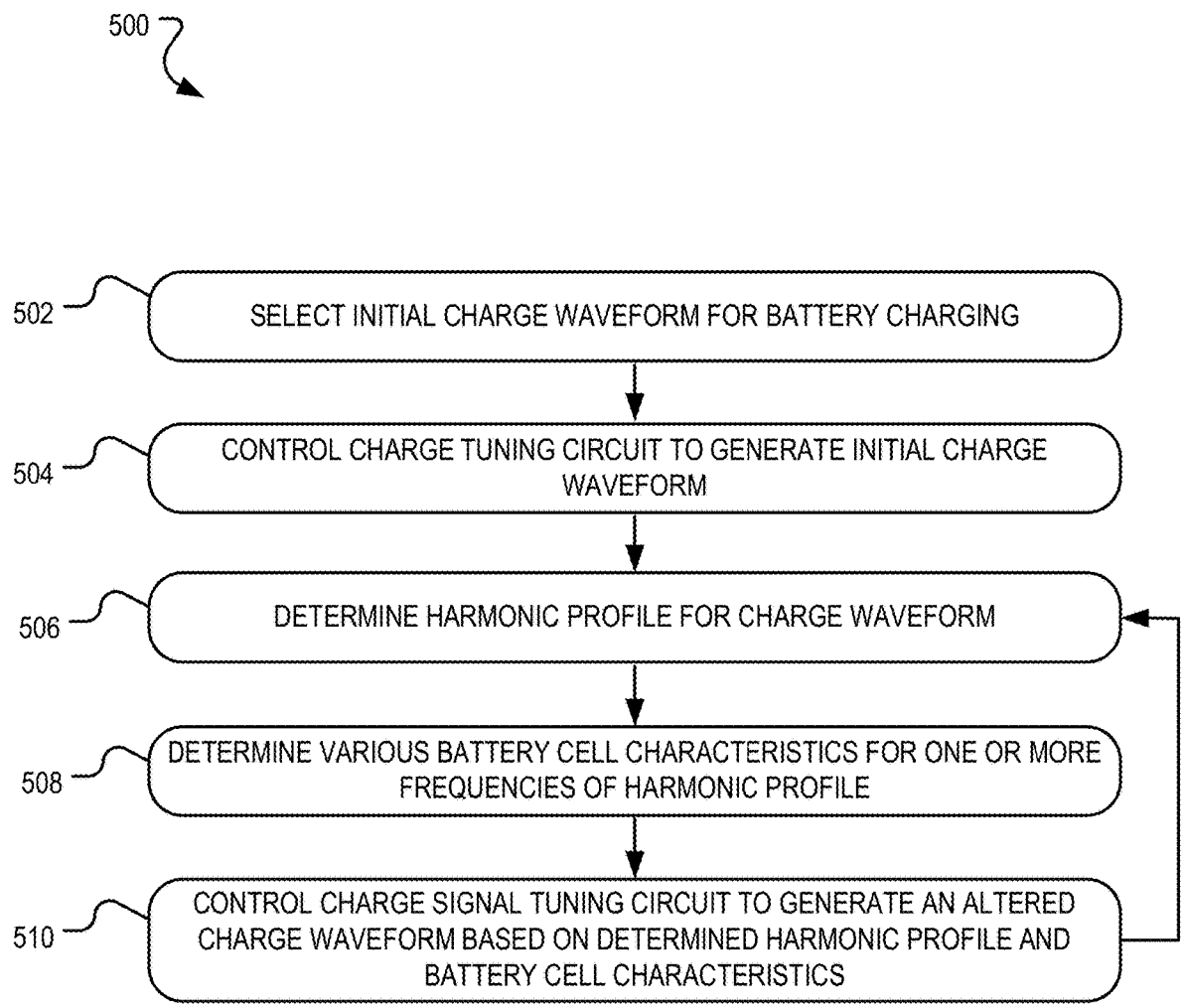
FIG. 5 is a flowchart illustrating a method for generating a charge signal for a battery cell based on a frequency corresponding to a minimum impedance value in accordance with one embodiment.

FIG. 5 illustrates one method 500 for generating or altering a charge signal for a battery cell based on a harmonic analysis of the charge signal response at the battery cell 204 in accordance with one embodiment. The operations of the method 500 may be performed by a circuit controller 210 and, in particular, by providing control signals to the charge signal shaping circuit 206. The operations of the method 500 may be executed through any number of hardware components, software programs, or combinations of hardware and software components.

Beginning in operation 502, the circuit controller 210 may select an initial charge waveform for a charge signal to be used to charge the battery cell 404. In the initial operation and in some possible implementations, the charge signal may be considered a characterization signal, which may impart some charge but is intended to generate a profile. In one example, the initial charge waveform may be selected by the circuit controller 210 to minimize or reduce the real impedance at the battery cell 204 during the initial charging of the battery. Initially, the impedance of the battery cell 204 may not be known by the circuit controller 210 as a charge signal or other characterizing signal has not yet been applied to the battery. Other characteristics, such as state of charge, temperature, and the like may or may not be known. In one particular example, the circuit controller 210 may select the initial charge waveform based on the state of charge, temperature, historical data of the battery cell 204, historical data of other battery cells of the same type, historical data of the circuit controller 210, or other battery recharge data. In one example, the circuit control may select a charge signal with some known harmonic or frequency attribute based on the type of battery cell, the state of charge, the number of cycles, and/or the temperature. The charge signal may be selected from some known set of charge signals and some predetermined knowledge of the effect of those charge signals on the battery. The known set of charge signal may be based on characterization of the same type of battery cell. For example, it may be known that some particular harmonic component or combination of components correspond to a relatively low impedance for a typical cell of the same temperature, state of charge, charge history, and/or otherwise. In another example, the initial charge signal may simply include a known harmonic component and be of a magnitude that will not negatively impact the battery. In another example, the circuit controller 210 may analyze previous charging sessions of the battery cell 204 or other battery cells. Based on the analysis, the circuit controller 210 may estimate a frequency $f_{Min}$ for the battery cell 204 at which the impedance, real or complex, of the battery cell is at or near a minimum and generate an initial charge waveform which includes a large harmonic component at and around frequency $f_{Min}$. Similarly, the initial charge waveform may suppress harmonics at other frequencies. In another example, the initial charge waveform may include a leading edge at or near the frequency $f_{Min}$ 412 corresponding to the minimum real impedance value determined above. The initial charge waveform may also include a defined leading edge, as opposed to a conventional sharp (high frequency) leading edge, as well as one or harmonic components defined base on the impedance effect of the same.

Regardless of how the initial charge waveform was selected, the circuit controller 210 may provide one or more control signals to the charge signal tuning circuit 206 to generate the initial charge waveform. However, as mentioned above, the characteristics of the battery cell 204 when charge is initiated and during charging may vary from however the battery may have been characterized as well as due to various changes that may occur during charging. For example, the state of charge and the temperature of the battery cell 204 may alter the harmonic profile of the battery. As such, altering the charge waveform in response to the changing characteristics of the battery cell 204 may provide benefits to charging the battery. Thus, beginning in operation 506, the circuit controller 210 may generate or otherwise determine a harmonic profile characterizing the impedance effect of various harmonic components of a charge waveform on the battery cell 204. The harmonic profile may generally include battery cell characteristics for various harmonic frequencies of the charge signal in operation 508. In one example, the circuit controller 210 may apply one or more characterization signals, which may also be referred to as test signals herein, either as the charge signal, in place of the charge signal or in addition to the charge signal, with various harmonic components to the battery cell 204 to determine a battery cell response to the various harmonics In one instance, the harmonics of the characterization signal may be predetermined by the circuit controller 210 to provide a range of characterization signals and associated range or combination of harmonics to the battery cell 204. For each test signal, corresponding battery characteristics, such as an impedance values (real, imaginary and/or complex) responsive to the harmonic components of a given signal, may be determined and/or stored.

As explained in more detail below, the circuit controller 210 may then control, in operation 510, the charge signal tuning circuit 206 to adjust or alter components of the charge waveform based on the harmonic profile and battery cell characteristics. For example, the circuit controller 210 may control the charge signal tuning circuit 206 to increase a magnitude of the charge waveform corresponding to a harmonic at or near the frequency $f_{Min}$, which will effectively increase the transfer of charge energy to the battery cell at the harmonic associated with a relatively low impedance. Harmonics adjacent frequency $f_{Min}$ may be selected based on an impedance threshold or other threshold, a combination of energy transfer and impedance thresholds, and other criteria. It should also be recognized that even in a system only addressing a single harmonic, it may not be the case that the frequency associated with a minimum impedance is chosen. Moreover, in some instances the minimum frequency may not be known or the minimum frequency may be calculated based on other known points. Similarly, the circuit controller 210 may control the charge signal shaping circuit 206 to suppress harmonics at frequencies away from $f_{Min}$ to reduce the impedance at the battery cell. Altering the harmonic components of a charge signal has additional benefits including controlling or altering the temperature of the cell, more efficient charging and/or faster charging, Adjustments to the charge waveform may also be based on other characteristics of the battery cell 204, such as power, peak voltage, peak current, conductance, susceptance, and the like. Further, one or more operations of the method 500 may be repeated to continually monitor the harmonics of the charge waveform and adjust said waveform based on battery cell characteristics measured at the battery cell 204. Such feedback adjustments may continue for the duration of the battery charging or until the battery cell 204 is removed from the charging circuit 200.

The optimal harmonic or harmonics of the charge waveform may not necessarily be at the absolute lowest impedance. In a characterized system, for example, a battery may not be perfectly characterized for every state of charge, life cycle, temperature or other conditions and the characterization may make reasonable extrapolations and assumptions when selecting a harmonic component or frequency at which to define some part of a charge waveform. In other instances, the charge waveform may be defined and based on objectives not achieved simply by suppressing harmonics associated with the highest impedance and/or adding or enhancing harmonics at correspondingly low impedances. It is also possible that control may be such that the defined charge signal imprecisely effects harmonics, e.g., the generated charge signal does not precisely enhance or suppress any specific targeted harmonic. Hence, the use of "optimal" in the context of impedance or other values representative of the flow of current to or from an electrochemical device, harmonics (frequencies), or other measures discussed herein does not necessarily mean controlling harmonics associated with the lowest impedance, does not necessarily mean that the lowest impedance/harmonic correlation is known or precisely controllable, or that the controlling harmonics at the lowest impedance is the objective. Harmonic tuning may also be based on charging or discharging objectives that may be achieved with some form of harmonic tuning, which form of tuning may be sub-optimal for a different charging or discharging objectives. For example, relatively fast charging may be achieved with a different optimal harmonic tuning as compared to tuning for battery longevity, with harmonic selection for fast tuning possibly having a negative effect on battery longevity and vice versa. Also, as noted elsewhere herein, other measures may also be used, such as power or admittance or its components of susceptance and conductance. In the case of admittance, the optimal value may be associated with harmonics that provide maximum admittance, or values otherwise within some range of the maximum admittance, during charge or discharge.

It is also possible to tailor the charge waveform to effect impedance (or other value) of the electrochemical device to optimize effects on the electrochemical device. For example, the system described herein can operate to balance between charge rate and cycle life of the battery (e.g., number of charge and/or discharge cycles before the battery capacity falls to some threshold—e.g., 75% (lost 25% capacity)). In some instances, the system may determine a harmonic for the highest charge rate but application of a waveform to achieve that charge rate may not be optimal for cycle life. Hence, the system may apply a charge at a lesser rate than possible, which in turn may alter the harmonic component of the charge waveform as applying the charge at lesser rate may impact impedance. As noted, a charge signal may be continuous or may be intermittent and composed of a form of pulses. In the case of pulses, the leading or trailing edge of a pulse may be controlled to define a shape at a frequency, and the content of the pulse body may be composed of selected harmonics. The system may apply harmonically tailored charge waveforms with controlled combinations of duty cycle, frequency (e.g., of the charge pulse), and/or total period frequency (e.g., the combination of charge and rest) to balance between various possible real-time battery characteristics like charge rate and/or longer term battery characteristics like cycle life. For example, it is understood that relatively higher charge or discharge currents exhibit lower impedances in the cell, which generally speaking favors charge or discharge rates, but the higher charge or discharge rates, even though harmonically optimized by the complex impedance feedback discussed herein, will have some impact on cycle life as does any charge and discharge of a battery. Duty cycle has a strong influence on peak current. On the other hand, for a fixed current RMS, the frequency of the lowest impedance may benefit cycle life albeit at a lesser charge rate. Hence, the system may charge or discharge to optimize balance between different factors. Stated differently, aspects of the present disclosure may be operable to enhance charge or discharge rates relative to conventional technologies, and such improvements may also be done while accommodating other desirable outcomes such as optimizing cycle life under such conditions. In some such instances, charge or discharge rates may remain improved relative to conventional systems but operated at some level less than maximum to balance other factors.

As discussed above, the circuit controller 210 may determine or obtain a harmonic profile of the charge waveform provided to the battery cell 204. To obtain the harmonic profile, the circuit controller 210 may apply one or more transformations on the charge waveform. The type of transformation may depend on various attributes of the signal, the system in which the signal is being operated, the system generating the signal, the battery, the system running the transform, when the transform is applied, the real-time application of the transform versus offline or parallel signal characterization with charging and other factors. In one particular example, a fast Fourier transform (FFT) may be used to convert measured time domain data of the charge waveform (including voltage and/or current charge waveforms) to corresponding data in the frequency domain. In some instances and in addition to those noted above, the selection of the type of transformation used may depend upon the format of the data, the type of noise and signal to noise ratio in the data, and/or processor capabilities of a circuit controller or digital processing system. In some instances, a non-stationary function may be used as the basis for the time-to-frequency transformations. For example, a Bessel function is a single harmonic sine wave in which the amplitude decreases over time. Such a non-stationary function may provide a more accurate basis function for a transformation when applied to a non-stationary charge waveform generally used to charge a battery cell. Thus, although described herein as using an FFT-type transformation, it should be appreciated that variations in time-to-frequency transformations may be utilized, particularly transformations with a stationary and/or non-periodic basis function with a similar profile of a charge waveform for charging a battery cell so as to achieve low error in the transformation.

Figure 6A:
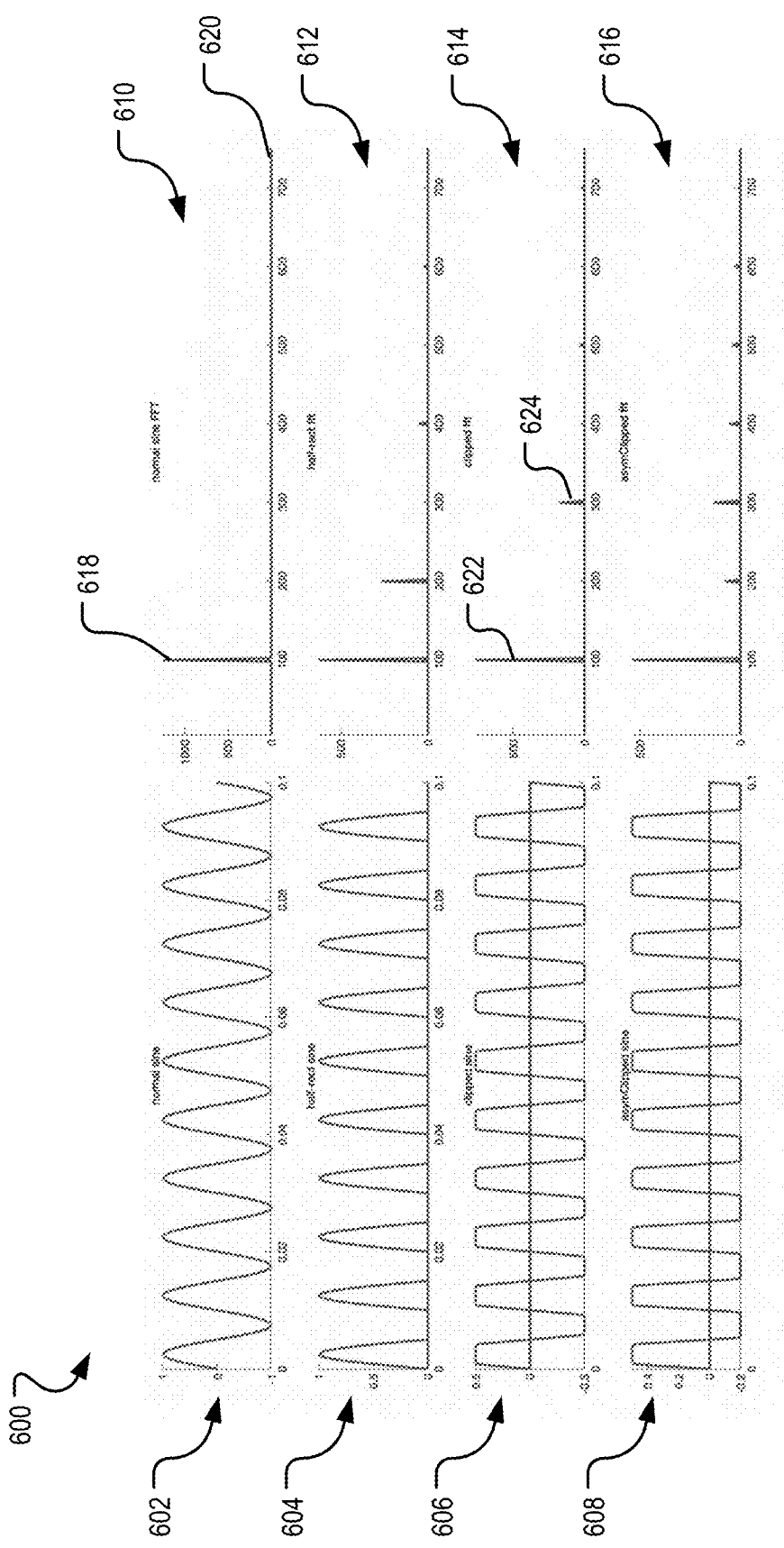
FIG. 6A illustrates signal graphs of example charge waveforms and corresponding frequency transforms of the example charge waveforms in accordance with one embodiment.

Nonetheless, by transforming the charge signal data into the frequency domain, the magnitudes of individual harmonics within the charge signal may be determined. FIG. 6A illustrates various example charge waveforms 602-608 and a corresponding transformation 610-616 of the example waveforms. For example, waveform 602 is a sine wave illustrated in the time domain such that waveform is plotted along a time axis. Because the waveform 602 is a simple sine wave with one frequency, the transform 610 of the waveform provides a magnitude 618 on a frequency axis 620 corresponding to the frequency of the sine wave 602. In contrast, waveform 604 includes a sine wave component at a particular frequency, but also includes dormant periods between active periods. This cutting off of the bottom portion of the sine wave component of the waveform and the dormant periods creates higher harmonics as part of the signal, as can be seen in the transformation plot 612 for the waveform 604. A waveform 606 or waveform 608 with a general sine wave pattern but clipped at the top and bottom may result in the transformation plot 614 or plot 616, respectively. Thus, the transformation plot 610-616 for a given charge waveform 602-808 may graphically illustrate the various harmonics present within the waveform. Further, the magnitude or height at frequencies in the transformation plots 610-616 indicates how much of the waveform shape corresponds to that particular frequency. For example, the waveform 606 is predominantly periodic at the frequency corresponding to spike 622, with smaller harmonic components at other frequencies 624 indicating a harmonic within the waveform at those frequencies but providing less influence on the overall shape of the waveform 606. In other words, a spike in the transformation plot 610-616 indicates the transformed waveform 602-608 includes a harmonic at that frequency, while the magnitude or height of the spike indicates the relative influence of that harmonic component on the overall shape of the waveform.

Figure 6B:
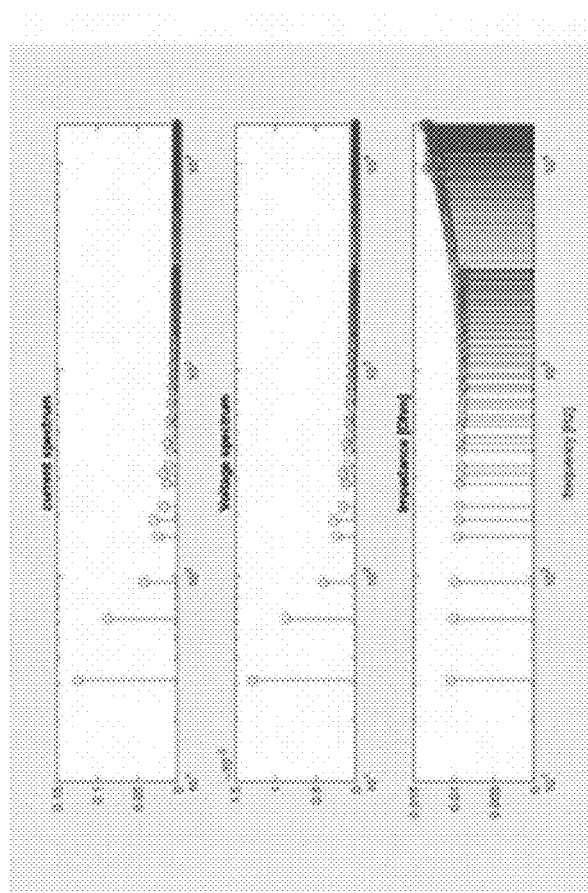
FIG. 6B illustrate transformed current and voltage waveforms illustrating various harmonics of the same revealed by transformations, and impedance at the respective harmonics.
Figure 6C:
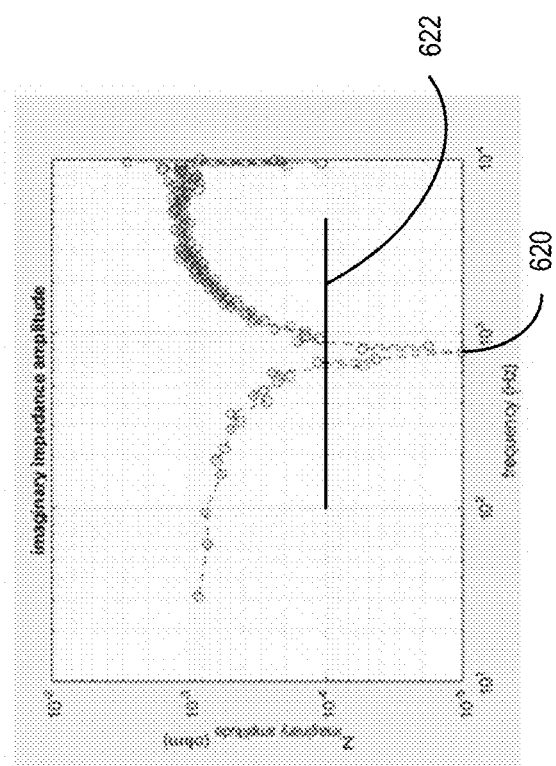
FIG. 6C is a different representation of the impedance of the respective harmonics illustrated in FIG. 6B.

FIG. 6B illustrates a current spectrum and voltage spectrum for transformed current and voltage representations of a charge signal respectively. As shown, each spectrum illustrates harmonics of varying scale at various frequencies. To the left of each spectrum, harmonics with relatively large scales are seen. The lower diagram shows the impedance of the various harmonics. Similarly, FIG. 6C is a diagram illustrating the relative impedance magnitude of the various harmonics, with the harmonic associated with the very lowest impedance at point 620.

As discussed herein and referring again to operations 508 and 510 as well similar operations discussed below, it can be seen that suppressing harmonics to the left or right (lower or higher frequencies) of the harmonic at the lowest impedance, particularly above a threshold such as shown at line 622, may deliver a charge signal with a relatively lower impedance. Moreover, enhancing the magnitude of harmonics at or near the lowest impedance harmonic, such as those below the threshold may deliver more energy at lower impedance. As discussed further below, in one example, the charge signal may be defined based on an inverse transform of a frequency domain signal or various possible representations thereof where one or more harmonics are enhanced and/or suppressed. A balance between harmonic suppression and sufficient energy delivery for overall charge performance may be necessary to achieve a suitably low impedance signal while delivering enough energy to charge in a sufficiently low time. In various instances, charge time relative to conventional techniques may be achieved. Moreover, additional capacity may be accessed without damaging the battery as compared to conventional techniques that may sacrifice taking advantage of the full theoretical capacity to avoid damage through over charge or over discharge.

In general, FFT transformation, in one example, is applied to a periodic or stationary waveform in which the harmonic properties of the waveform can be captured by looking at a small window of time. For example, the single harmonic 618 of waveform 602 may be determined from a transformation of one period or pulse of the waveform, even though the waveform 602 may continue for a longer period of time. That is, FFT transformations of periodic and stationary waveforms (waveforms whose properties do not depend on the time at which the series is observed) may provide a profile of the frequency content. FFT transformations of non-stationary and/or aperiodic waveforms, on the other hand, may be less accurate in both fidelity and temporal resolution. For example, a charge signal used to charge a battery cell adjusts over time due to battery characteristics, such as state of charge, temperature, etc. and may include several components at varying levels of fidelity. Observed over the entirety of a charging session, the charge waveform may include a slowly or step-wise decreasing charge current signal, which may continue for minutes or hours. At a finer fidelity, the charge waveform may include repeating pulses that occur every few milli- or micro-seconds. At an even finer fidelity, the charge waveform may include a noise component that may occur on a nano-second level. One or more of these components of the charge waveform may not be obtained during a transformation, depending on a selected timeframe for the transformation. For example, a transformation applied to the entirety of the charge waveform over the duration to fully charge the battery cell will be unable to resolve or accurately represent noise with harmonics of ns-level time constant. Alternatively, limiting the transformation to smaller periods of time to obtain the noise harmonics will neglect slower harmonics of the overall charge waveform, missing potentially behaviors of the signal. As such, traditional time-to-frequency transformations applied to battery cell charge waveforms may miss some harmonics of the charge waveform, providing errors in the analysis of the waveform.

Figure 7:
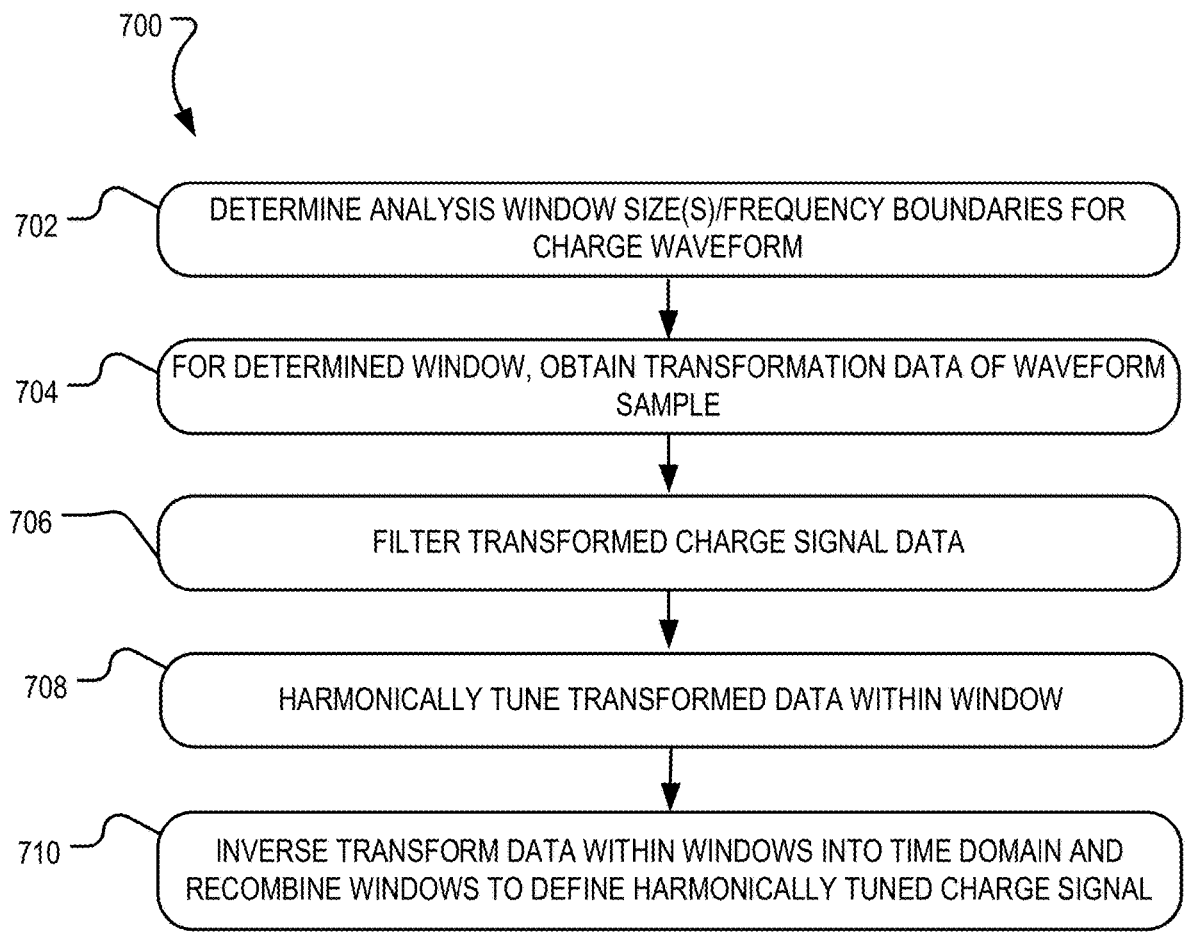
FIG. 7 is a flowchart of a method for obtaining a harmonic profile of a charge waveform utilizing a domain transform with windowing in accordance with one embodiment.

To improve the fidelity of time to frequency analysis of a charge waveform, the circuit controller 210 may execute the method 700 of FIG. 7 that includes a windowed transformation process. In particular, the circuit controller 210 may include a digital signal processing system for obtaining data of a charge signal or waveform (such as a charge current waveform, a charge voltage waveform, etc.), execute a domain transformation of the charging signal data, and determine harmonic profiles for voltage and current. The operations of the method 700 of FIG. 7 may be executed utilizing hardware components of the circuit controller 210, one or more software programs, or a combination of both hardware components and software programs.

Figure 8:
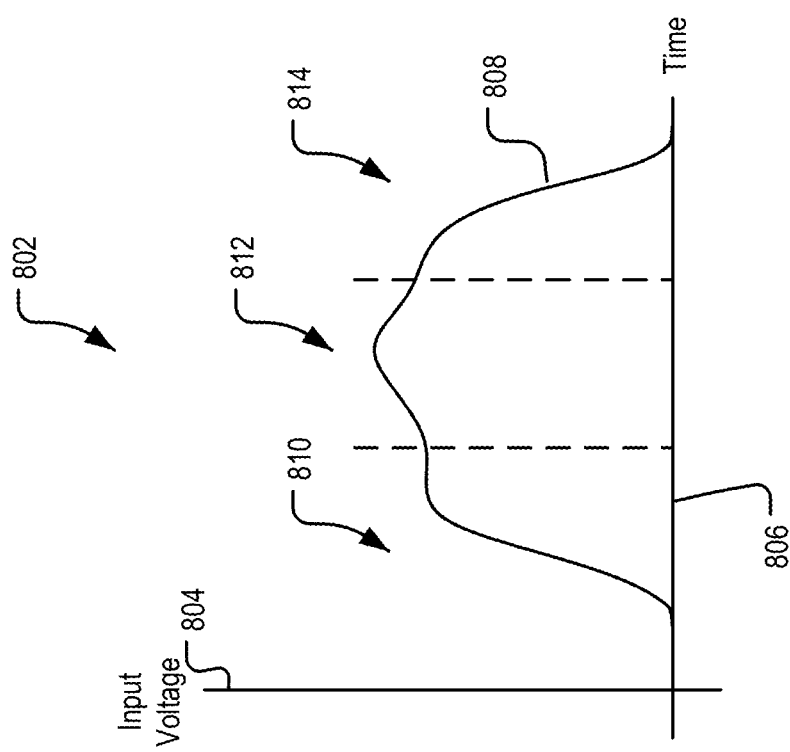
FIG. 8 is a signal graph of an example charge waveform divided into segments for obtaining a harmonic profile of the charge waveform in accordance with one embodiment.

Beginning in operation 702, the circuit controller 210 may segment the charge waveform into two or more sections to define an analysis window for the transformation, analysis and charge signal manipulation performed based on the transformed data. Generally, the system identifies a period of the signal to be analyzed. For example, FIG. 8 illustrates a signal graph 802 of an example a charge waveform 808 that may include several harmonics. The particular graph 802 illustrates a voltage-controlled charge waveform, although a current-controlled charge waveform may also be utilized to charge a battery cell 204. In either instance, both voltage and current charge signals may be subject to analysis unless one or the other is not accessible, in which case a single signal may be analyzed, albeit with a lower degree of information. The waveform 808 of FIG. 8 is illustrated as divided into three sections, namely section 810, section 812, and section 814. It should be recognized that the system may operate based on analysis of a single section or without time windowing the waveform. Each segment 810-814 of the waveform 808 may correspond to a particular time window or portion of the overall duration of the waveform and may define the analysis windows for performing domain transformations. In general, the waveform 808 may be segmented into any number of analysis windows 810-814 with or without overlap. The number and/or size of the analysis windows may be based on any number of factors, including processing power of the circuit controller 210, a size of storage available for storing obtained waveform data, historical analysis of similar waveforms and/or battery cells 204 under charge, and the like. The window definitions may also be based on characteristics of the signal, such as from filters obtaining statistical information concerning the signal such as various frequencies attributes of the signal, magnitudes of such frequency attributes, and/or where in time such frequency attributes occur. In one instance, the size of the analysis window 810-814 may be selected to obtain a particular granularity or fidelity of harmonic analysis of the charge waveform 808. In general, the smaller the analysis window 810-814, the more resolution may be obtained. Therefore, in some instances, the window size may be selected to allow transformation analysis of a noise component or other fast moving components of the charge waveform 808. In this manner, the size of the analysis windows may be selected to obtain particular frequencies or harmonics of the charge waveform. For example, the analysis window size may be selected to identify harmonics associated with noise in the charge waveform, which typically occur at very high frequencies. For lower frequencies, a larger analysis window size may be selected to accurately capture the longer waveform period of lower frequencies. Also, the size or boundaries of one analysis window 810 may be different from that of the size or boundaries of another analysis window 812. Still further and discussed in more detail below, multiple analysis windows may be generated and manipulated simultaneously, such as an analysis window that includes the entire charge waveform and a smaller analysis window set to obtain a smaller portion of the charge waveform.

For a determined analysis window, the circuit controller 210 may obtain domain transformation information for the portion of the charge waveform that is within the analysis window in operation 704. Using the waveform 808 of FIG. 8 as an example, the circuit controller 210 may receive the data points of the charge waveform contained within analysis window 810 and perform a transformation on the received data of the charge waveform. The obtained data or information may also be saved in a database or other medium and some operations performed remotely or by the system accessing the stored information. The transformation may provide an indication of the harmonics within the sample of the charge waveform 808 within the analysis window 810.

In one particular instance, a band filter or other types of filters may be applied to the charge waveform data, and particularly to the data within a given window, to reduce artificial harmonics that may occur due to the windowing analysis technique at operation 706. The upper frequency and/or the lower frequency of the band filter applied for analysis window 810 may be based on the size of the analysis window, the harmonics intended to be obtained (lower harmonics or higher harmonics), the data processing limitations of the circuit controller 210, and the like. Additional operations to obtain frequency and time information from the section of the charge waveform is described in more detail below.

The circuit controller 210 may determine if the analysis window is at the final or last position for analysis. As mentioned above, analysis windows may be applied across some period of the charge waveform 808 to isolate and analyze the discrete areas of the waveform and to identify harmonics in those windowed areas, and a domain transform analysis may be applied to each segment of the charge waveform 808. In the example of FIG. 8, analysis window 814 is the last analysis window location as the window has been applied along the charge waveform 808. It should be noted that window sizes may vary. The system may apply such windows in different ways. In one example, if the current window placement on the charge waveform 808 is not the last position, then the system applies the analysis window to the next set of boundaries in operation 708. For example, after obtaining domain transform information for the segment 810 of the charge waveform 808, the circuit controller 210 may determine the boundaries for segment 812 and return to operation 704 to obtain domain transform information for segment 812. In some instances, obtaining domain transform information for segment 812 may further include applying a band filter to the frequency boundaries of the analysis window to remove or reduce harmonics at the window edges. This repeating process of applying the analysis window along the charge waveform 808 and obtaining domain transform information as the window is applied along the waveform may continue until the final window location is reached, such as at the end of a pulse of the charge waveform 808 or at the end of the duration of the charging session.

For the transformed data of any given window, the system may harmonically tune the charge signal pertaining to the window in operation 708. In some instances, no tuning will take place. In some instances, harmonics may be suppressed or enhanced, which may include removing harmonics or adding new harmonics within any given window. Harmonic tuning, as discussed herein, may be related to the impedance effect of any given harmonic and may be based on whatever the charge optimization criteria that can be affected by altering harmonic content of the charge signal.

After harmonic tuning, the system inversely transforms the harmonic tuned data back into the time domain and recombines the windows in operation 708. The recombined windows of time domain data, with some combination of the data within any given window having had a harmonic suppressed or enhanced, defines the charge signal to apply to the battery. If, for example, a harmonic within one window is suppressed due to it being associated with a relatively higher impedance, the new charge signal will transfer energy to the battery with less impedance due to the suppression of the harmonic. Similarly, if a harmonic was enhanced due to it being associated with a relatively lower impedance, the charge signal will transfer more energy at the harmonic. Any harmonically tuned content from any window of data may be in the reconstituted and harmonically tuned charge signal. The system applies the harmonically tuned charge signal in the time domain, e.g. by the charge tuning circuit. Any filtering used on a window may be used to properly reconstitute the charge signal from the various windows.

As discussed above, high impedance at the battery cell 204 may occur at high frequencies or harmonics such that the domain transform analysis of the charge waveform 808 may not accurately identify those harmonics providing high impedance results at the battery cell 204. Therefore, obtaining a harmonic profile of the entire charge waveform 808 at once may include errors or overlooked harmonics that may negatively impact the effectiveness of the charge waveform. Through the transformation and windowing method 700 of FIG. 7, however, a high-resolution harmonic profile may be obtained providing both low frequency harmonics and high frequency harmonics. This high-resolution harmonic profile for the charge waveform 808 may provide more accurate control over the shaping of the charge waveform used to charge the battery cell 204.

FIGS. 9A and 9B illustrate a rolling analysis window for a current charge waveform 908 and a voltage charge waveform 928, respectively. As shown, the analysis window for performing domain transform analysis may be applied to either type of charge waveform. In particular, graph 902 illustrates a current waveform 908 plotted along measured amps 904 and state of charge 906 of the battery and graph 922 illustrates a voltage waveform 928 plotted along measured amps 924 and state of charge 926 of the battery 204. A transform analysis window 910, similar to that described above, may be determined and slid along the charge waveform 908 as the state of charge of the battery cell 204 increases. Similarly, an analysis window 930 may be determined and slid along the charge waveform 928 as the state of charge of the battery cell 204 increases. In some instances, domain transform analysis may be performed on both a current portion of the charge waveform 908 and a voltage portion of the charge waveform 928 to obtain the harmonic profile. In another instance, a voltage charge waveform 928 may be analyzed as described above while a current response at the battery cell 204 may be analyzed in a similar manner to determine the harmonic profile of a charge waveform. In general, domain transform analysis of any component of a charge waveform may be performed as described.

As mentioned above, the width of the analysis window 910, 930 may be based on several factors, including processing resources, dynamic signal complexity, charge waveform control techniques, and the like. Further, in some embodiments, the window size (or frequency range defined by the analysis window) may be adjusted or adapted based on measured characteristics of the charging circuit 200. For example, the window boundaries may be increased or decreased based on a processing speed of the circuit controller 210 to process the data collected within the window or based on how quickly the corresponding charge waveform 908, 928 is changing within the window. Further, multiple analysis windows may be used simultaneously to obtain different domain transform information from the charge waveform 908. For example, the circuit controller 210 may sample the data of the charge waveform 908 at a high-resolution within the analysis window 910 to identify high harmonics within the charge waveform corresponding to the waveform within the analysis window 910. In addition, the circuit controller 210 may down-sample waveform data (or discard portions of previously obtained waveform data) once the analysis window 910 has moved past the corresponding portion of the waveform. This down-sampled data may be used to perform domain transform for lower harmonics of the charge waveform 908 that may not be visible strictly from the data within the analysis window 910. Thus, the circuit controller 210 may maintain and transform high resolution harmonic information for data within the analysis window 910 and lower resolution harmonic information for data outside the analysis window 910 (or portions of the charge waveform 908 that have already occurred). The use of multiple analysis windows at different fidelities may further improve the harmonic profile obtained for the charge waveform.

Figure 10A:
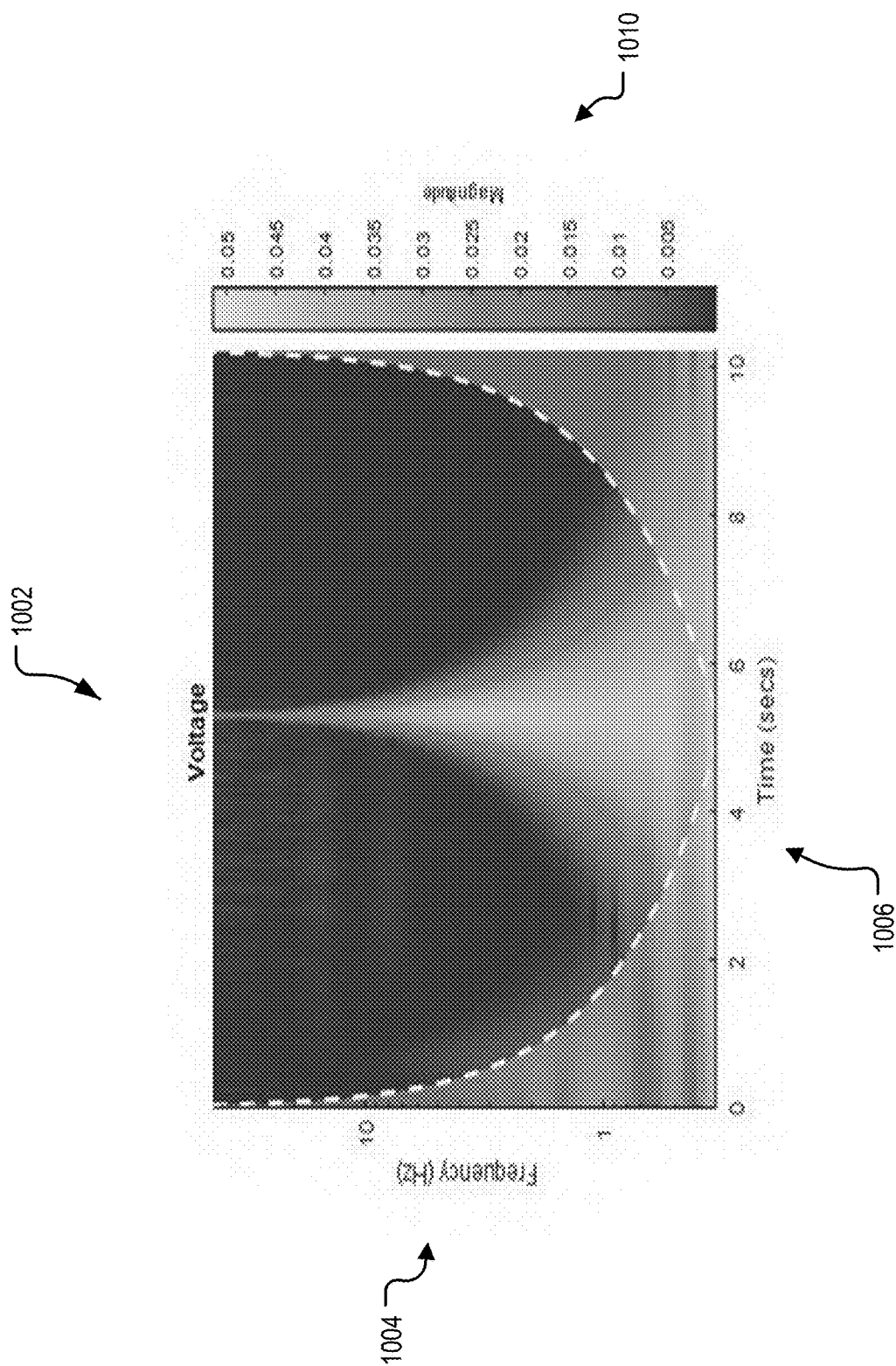
FIGS. 10A and 10B are graphs of a harmonic profile of a current charge signal and a harmonic profile of a voltage charge signal in accordance with one embodiment.
Figure 10B:
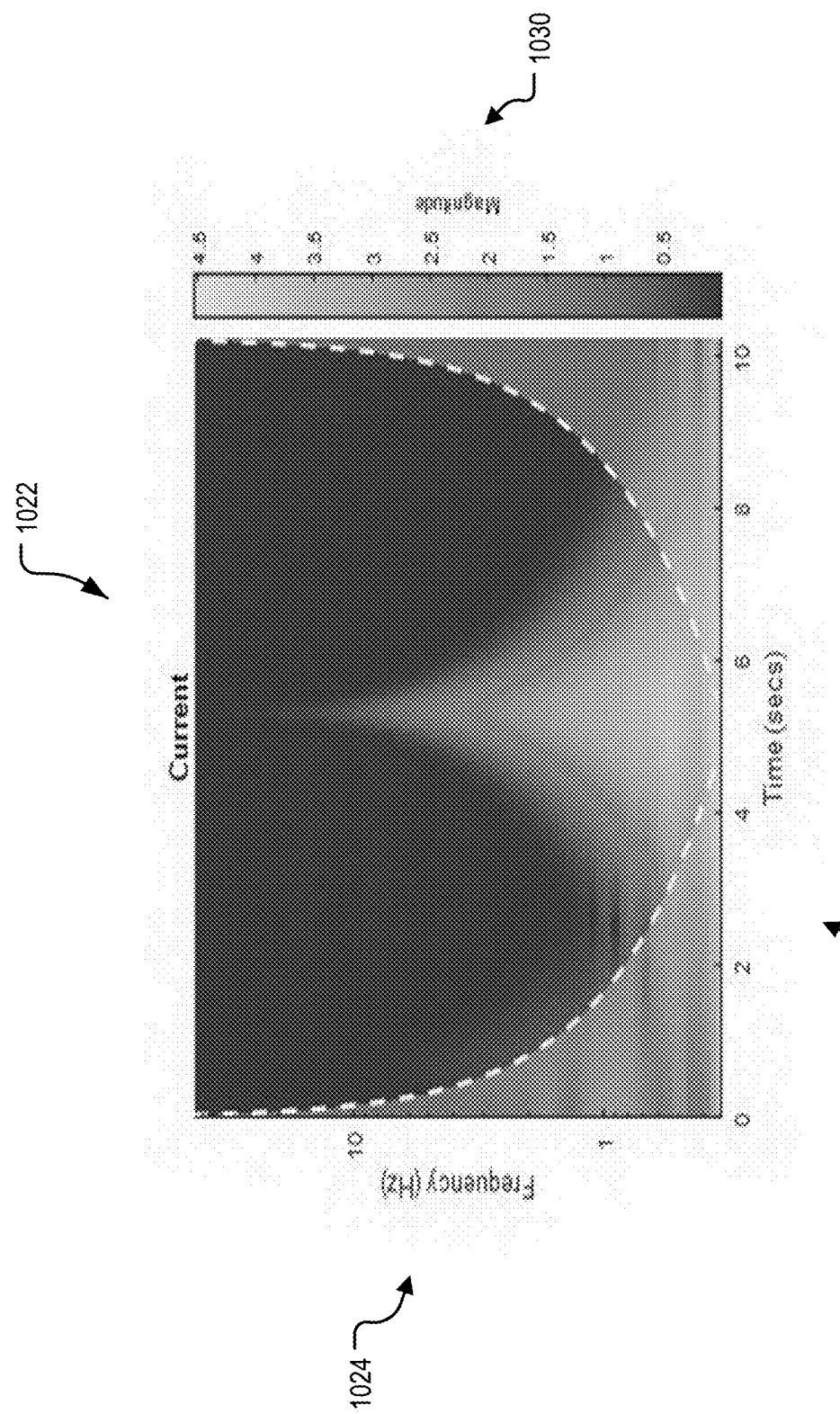
Figure 10C:
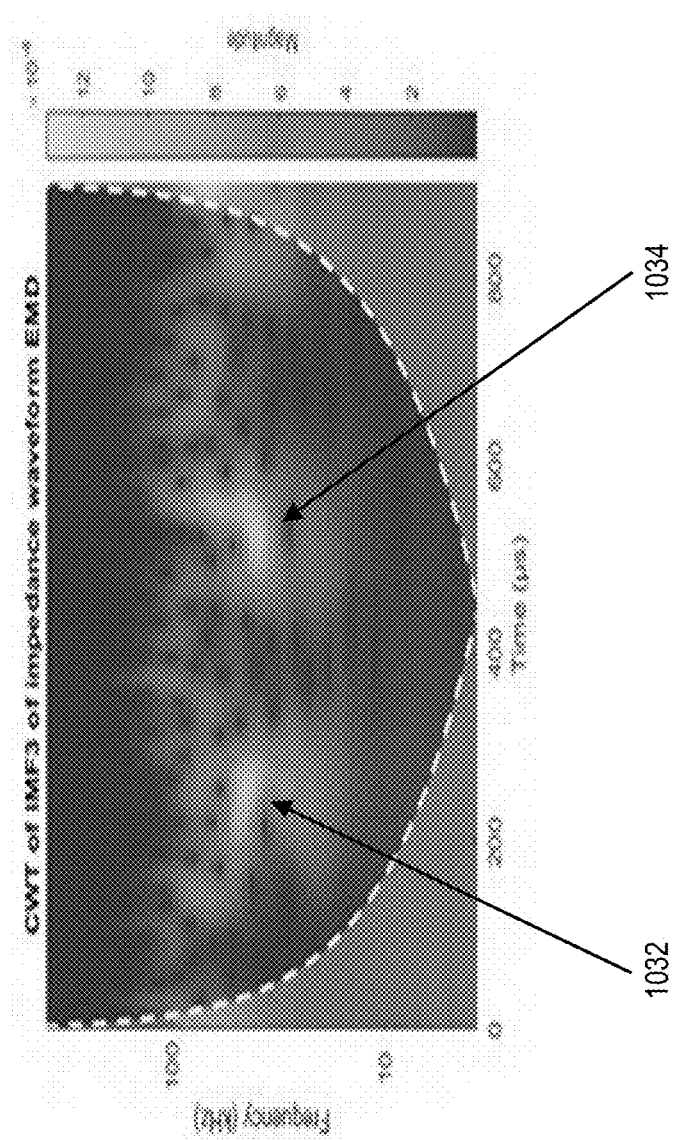
FIG. 10C is a graph of impedance for a range of harmonics in accordance with one embodiment.

The circuit controller 210 may use the harmonic profile obtained as described herein to adjust a charge waveform applied to a battery cell 204 to charge the battery. For example, FIG. 10A illustrates a plot of wavelet information or data of a voltage charge waveform. In particular, plot 1002 illustrates obtained harmonic magnitudes 1010 with frequencies (y-axis 1004) and time (x-axis 1006) of a voltage charge waveform. The information of plot 1002 may be obtained through a wavelet filtering process discussed herein. In a similar manner, plot 1022 illustrates obtained magnitudes 1030 of various harmonics with frequency information (y-axis 1024) versus time information (x-axis 1026) of a current charge waveform. The plots 1002, 1022 provide information on the harmonic content of the charge waveforms during a charging session of the battery cell 204. In the examples of FIGS. 10A and 10B, the corresponding wavelets used to obtain the frequency and time information pertain to at least a frequency of 1 to 10 Hz. As discussed in more detail below, wavelets may be used to isolate or otherwise focus on different portions of the charge waveform to assess the harmonic content of the same.

FIGS. 10A and 10B illustrate magnitudes of various harmonics within a part of the charge signal corresponding to an applied wavelet. FIG. 100 illustrates impedance magnitudes at various harmonics. The higher impedance harmonics 1032 and 1034 being shown at approximately 70 kHz and between 200 μs and 300 μs, and 500 μs and 600 μs, respectively. The impedance plot of FIG. 100 is related to a voltage or current plot, like those of FIGS. 10A and 10B but from a wavelet that focused at least on a portion of the charge signal between 10 and 100 kHz. Nonetheless, with the impedance obtained for the various harmonics present in the signal, the circuit controller 210 may utilize a harmonic profile of the charge waveforms, which in two examples may be derived from the voltage and current information of the signals at the various identified harmonics among other ways, to define a charge waveform. For example, the circuit controller 210 may be configured to determine battery cell characteristics, such as an impedance at the battery cell 204, delivered power, conductance at the battery cell, etc. at or associated with the harmonics identified by the various described transforms, including a transform, the windowing technique described above, the wavelets techniques described below and otherwise. If the battery cell characteristic indicates an inefficient or damaging charging waveform at a particular harmonic or harmonics, the circuit controller 210 may define or adjust the charge waveform to suppress, e.g., remove or reduce, portions of the waveform corresponding to the inefficient harmonic. Alternatively or additionally, the circuit controller may enhance (e.g., include or amplify) portions of the charge waveform corresponding to a particularly efficient harmonic or harmonics. In these manner, alone or in combination, the obtained transform information of the charge waveforms (voltage, current or both) may be used to control the charge signal shaping circuit 206, which may be to maximize efficient transfer of power to the battery cell 204, reduce harmful or inefficient harmonics in the charge waveform, among other advantages.

Figure 11:
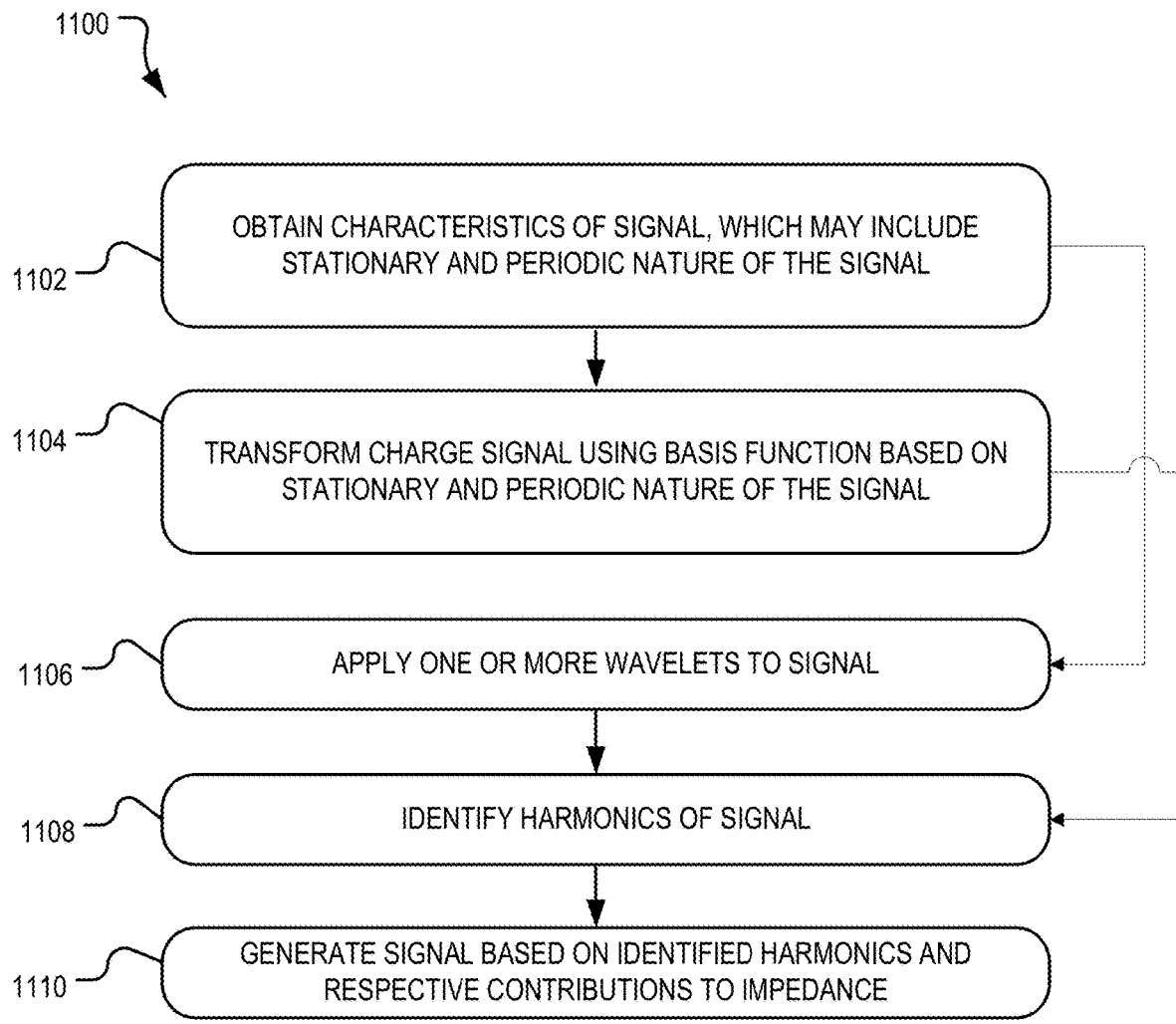
FIG. 11 is a flowchart of a method for executing a wavelet frequency transform function for a charge waveform in accordance with one embodiment.

FIG. 11 illustrates a method using a transform with a basis function representative of the stationary and periodic nature of the charge signal or using a wavelet. Because some aspects of the methods overlap, they are discussed in combination. It should be recognized that each may be practiced independently.

To begin, the charge (or discharge) signal is characterized in operation 1102. Depending on control and battery characteristics among other things, a charge signal may have stationary and periodic characteristics. In many instances, a charge signal may be considered relatively non-stationary and relatively aperiodic. Generally speaking, the stationary nature of the charge signal refers to statistical features of the signal and whether or not those statistical attributes vary (non-stationary) or not (stationary) over time. Such features may refer to some minimum, maximum, average, mean, or other feature of the signal. For example, if the maximum current or voltage magnitude of the signal varies, those are non-stationary features of the signal. The periodic nature of the charge waveform refers to repeating behavior of the signal, such as within a given window of time. The repeating behavior may extend outside of the windows. A sine wave, not decaying or otherwise changing in magnitude over time, is one example of a stationary and periodic signal. An aperiodic feature of a signal is a non-repeating feature. Strictly speaking, a Bessel function is an example of an aperiodic signal with strong resemblance to a periodic signal, which may be described as non-stationary due to its apparent sine like pattern with decreasing magnitude. The charge signal may be prescreened using various filters and other statistical evaluation techniques or may be analyzed at various points during a charging session. The process may be continuous, periodic, and/or may be conducted based on a change in the battery (e.g., peak voltage, impedance, etc.), based on change in state of charge, change in temperature, and other factors.

Based on the stationary and periodic nature of the charge signal, the system may use a variety of different possible basis functions for a transform to be applied to the signal, or a portion thereof in operation 1104. For example, the system may use a transform with a basis function aligned with the stationary and periodic nature of the charge signal. Generally speaking, the intent is to use a basis function comparable to the stationary and periodic nature of the charge signal. In some instances, the basis function may be selected in advance based on pre-characterization of the signal. In other instances, the basis function may be chosen, e.g., by the system while charging, for some selection of known basis functions with various possible stationary and periodic relationships. In some instances, rather than assess the stationary and periodic nature of the signal, the system may use a polynomial or other representation of the signal itself as the basis function. Such a representation contains the stationary and periodic nature of the signal through using the representation of the signal itself.

It can be understood that a transform may utilize a function that is especially suited for accurate analysis of the stationary and periodic nature of the charge signal. For example, a LaPlace transform could be used for non-stationary signals, as well as other types of transforms with signal dampening built into the basis function of the transform. Altering the base function of the transformation may enable accurate resolution of harmonics within a non-stationary charging signal (either voltage or current, or related information).

In some instances, the circuit controller 210 may utilize Fourier Transform-based techniques (FT) that are based on functions other than a sine wave. In some examples, FT techniques described herein use a sine wave as the base function for performing the time-to-frequency transformation in which the transformation identifies different sine wave properties within the transformed waveform. However, FT using a sine wave function as the basis may not be optimal for non-stationary, aperiodic signals. Therefore, in one embodiment, the circuit controller 210 may use a non-stationary and non-periodic (aperiodic) function as the basis for the transform. One example of such a basis function is a modified Bessel function, which involves oscillation similar to the more familiar single harmonic sine wave, yet in which the amplitude decreases over time. Such a non-stationary function may provide a more accurate FT technique when applied to a non-stationary charge waveform. In general, and as noted, however, base functions for FT techniques (or other transforms) with similar non-stationary and aperiodic natures as the signal being transformed provide the most accurate transformations. In one example, the basis function may include an example charge waveform (or representation thereof) used to charge the battery 204 or a similar battery type as the battery under charge. For example, the circuit controller 210 may store charge profiles for different types of battery cells that indicate a charge waveform previously used for charging. Such charge profiles may be selected, perhaps based on a characteristic of the battery 204 under charge and used as the basis function for the transform techniques performed above. As the charge profiles may be non-stationary and aperiodic, a transform technique using the charge profile as a basis may provide a more accurate transformation of a similar non-stationary and aperiodic charge waveform.

The domain transform with the basis function based on the stationary and periodic nature of the charge signal may also be used with the windowing technique discussed above, including the various aspects of the technique that harmonically tune the signal within a window and reconstitute the charge signal.

One particular method 1100 for executing a wavelet transformation is illustrated in FIG. 11. The circuit controller 210 may execute one or more of the operations of the method 1100 to obtain transform information from a charge waveform, as described above with relation to operation 506. However, other transform techniques may be executed to obtain the harmonic profile of the charge waveform as the method 1100 of FIG. 11 is but one example of such a technique. Beginning in operation 1102, the circuit controller 210 may execute one or more time-to-frequency transformations on the charge waveform or portion of the charge waveform. In one particular example, the circuit controller 210 executes one or more wavelet transformations on the charge waveform. As discussed above, the transform provides information on a harmonic profile, or spectrum, of a waveform.

In operation 1104, the circuit controller 210 may obtain the transform function of the waveform through advanced filtering techniques or executing another transformation on the frequency domain waveform. In general, the transform function is obtained to remove or separate portions of the charge waveform, such as noise components within the circuitry of the circuit controller 210, which may not be useful in understanding the effect of the charge signal on the battery cell. This transform function provides a new spectra of the charge waveform and allows for better distinction of regions in the waveform data. Obtaining the transform function allows the circuit controller 210 to identify and obtain the portions of the waveform that correspond to the most relevant harmonics of the charge waveform in operation 1106. More particularly, with the cleaned frequency spectra obtained via the transform function, the most active harmonics of the charge waveform may be identified. In some instances, high and low thresholds may be identified to create frequency boundaries around the active harmonics to define different bands and their bandwidths for isolated analysis. In one implementation, each band may be isolated using band filters, such as a bandpass filter, determined by the defined different bands.

In operation 1106, the system may apply one or more wavelets to the signal. Alternatively or additionally, the stationary and periodic nature of the charge signal may also be used to select or otherwise inform the selection of a wavelet or wavelets to apply to the charge signal. A wavelet-based technique may be used in place of the transform techniques discussed herein including the windowing technique discussed above. One or more wavelets may be applied to the charge signal to obtain harmonic content of the signal. A wavelet may be considered a specialized filter applied to the time charge signal. As illustrated in FIGS. 10A and 10B, application of a wavelet may obtain time and frequency domain information about the signal, or portion of the signal. In some instances, a particular wavelet is applied to a discrete portion of the charge signal. In some instances, the system may select a center frequency of the wavelet based on a harmonic frequency and a bandwidth of the wavelet may be chosen based on assessing harmonics adjacent the target harmonic of the center frequency.

In one example, one or more complex Morlet wavelet transforms may be used, with scaling and shifting to identify various harmonics of the charge signal. A Morlet wavelet provides phase information as well as magnitude information of signal harmonics. In a simple example, a signal may include a relatively high magnitude harmonic at 20 kHz, which indicates that it is responsible for relatively high amount of power being transferred to the battery. The target harmonic may be identified or known through the various techniques described herein. There may be harmonics associated with the 20 kHz harmonic, which may not necessarily be sinusoidal in nature and may be at frequencies very hear the target harmonic, e.g., 20.001 KHz. The adjacent harmonics may or may not be in phase with the target wavelet. The Morlet wavelet may be tailored to isolate the 20 kHz harmonic from the charge signal and may also capture information about the adjacent harmonics. In such an example, a center frequency of the wavelet may be 20 kHz, and a bandwidth to capture the adjacent harmonics. The bandwidth, time and frequency domain, may further be scanned to capture features. The bandwidth of the wavelet may be chosen to not overlap with other relatively high magnitude harmonics, which may be targeted by other wavelets. Depending on the number of targeted harmonics, the system may apply different wavelets to determine the presence of, in time, and magnitude of harmonic at some frequency.

Alternatively, transformation of the signal, with or without statistical characterization of the signal and with or without windowing, may be used to identify features of the signal, e.g., harmonics that are then used to inform the selection of a wavelet or wavelets, and attributes of the same, to apply to the signal. In such a case, any selected wavelet is applied to the time domain charge signal. In some situations, a wavelet may be applied to the signal to identify harmonics of interest as well as attributes of those harmonics. In other instances, one or more of signal characterization, domain transform, and windowing may be used to identify attributes of the charge signal and inform the selection of the wavelet or features of the wavelet such as center frequency and bandwidth.

As noted, one or more wavelets may be applied to the charge signal. Wavelets, and attributes thereof, may be predetermined and used at the start of any charge or discharge cycle. Such wavelet application may be applied at the beginning of charge or discharge and/or may be repeatedly applied during the same, and harmonic tuning performed based on impedance associated with harmonics identified by any applied wavelet. Besides identifying harmonics, the system may also use harmonic magnitude as part of a given harmonic tuning process. Wavelet selection as well as characteristics of the wavelet may be altered during a cycle.

The application of a given wavelet may be considered a channel. The system may use impedance information pertaining to a specific harmonic (e.g., the 20 kHz harmonic identified by the 20 kHz Morlet wavelet) identified by the channel or may more generally assess impedance of the channel. In any event, as discussed herein, the system may then harmonically tune the signal based on information from the wavelet as well as impedance associated with that information.

Irrespective of the techniques, at some point the system identifies harmonics of the signal and the contribution of the harmonic to impedance (operation 1108). The system may define or alter the charge signal based on the impedance at a harmonic as discussed herein. In the case of a transformed signal where harmonic manipulation has occurred in the frequency domain, the circuit controller 210 may execute an inverse transform of the modified frequency domain signal or windowed portion thereof. Stated differently, the frequency domain representation (or representations) of the charge waveform may be modified to suppress or enhance various harmonic attributes, and the modified frequency domain representation inversely transformed to define a charge signal, which may be a current waveform reconstruction, with the respective harmonics suppressed or enhanced. The harmonic tuning controller generates the signal. As discussed above, such adjustment to the charge waveform may include amplifying an identified harmonic and suppressing or eliminating an identified harmonic from the charge waveform. Thus, through the method 1100, these individual components may be analyzed to determine the effect each component may have on the charge waveform and adjustment to the charge waveform may be made based on such analysis. Further, by limiting the analyzed portions of the waveform to identified regions or bands, a reduction in the processing power needed to analyze the charge waveform is achieved. In the case of application of wavelets, the definition of the charge signal and harmonic tuning is performed in the time domain.

The methods discussed herein may be performed in real-time or near real-time, done in parallel with charging operations, and/or performed in a form of pre-characterization process the result of which defines harmonically tuned charge signals to be applied in various circumstances. For example, if a sequence of windows are to be analyzed or a set of wavelets to be applied, e.g., over 10 seconds of a charge signal or in accordance with 5 or 10 different wavelets, the signal attributes may be obtained from the harmonic tuning process performed while charging is ongoing, and with the new signal definition being applied after the process is complete and the harmonically tuned charge signal defined. The time chosen, e.g., 10 seconds, may provide a representative sample of the data that is representative of the charge signal over a larger time period. As noted, such analysis may be done in advance of charging (or discharging), done continuously, performed based on triggers and/or performed at different points, periodically or otherwise, during the course of charging (or discharging).

The various methods discussed herein may be practiced in a variety of different processing environments. For example, with reference to FIG. 2, a charge signal tuning circuit, circuit controller and battery cell measurement circuit may be embodied in a processor, ASIC, stand-alone circuits, and combinations of the same. A computing environment will include computer memory, in different possible forms, where instructions for controlling the processes and information related to the battery, measurements of the same, computations such as impedance, and other information may be available to the various possible circuits and/or processing configurations. Various control schemes may be provided in a device being powered by a battery, may be provided in a battery pack, may be provided in stand-alone charging for a battery, may be provided in a remotely connected computing environment, whether mobile or otherwise, and in other possible arrangements.

Figure 12A:
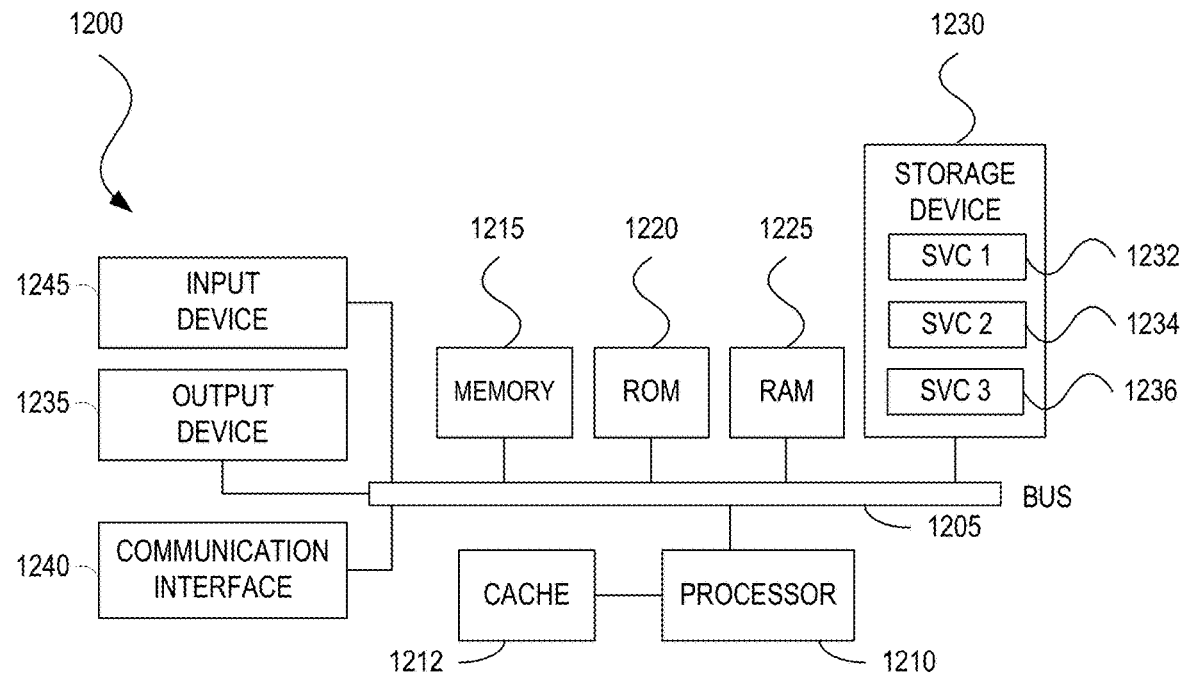
FIGS. 12A and 12B are diagrams illustrating example computing environments and system which may be used in implementing embodiments of the present disclosure.
Figure 12B:
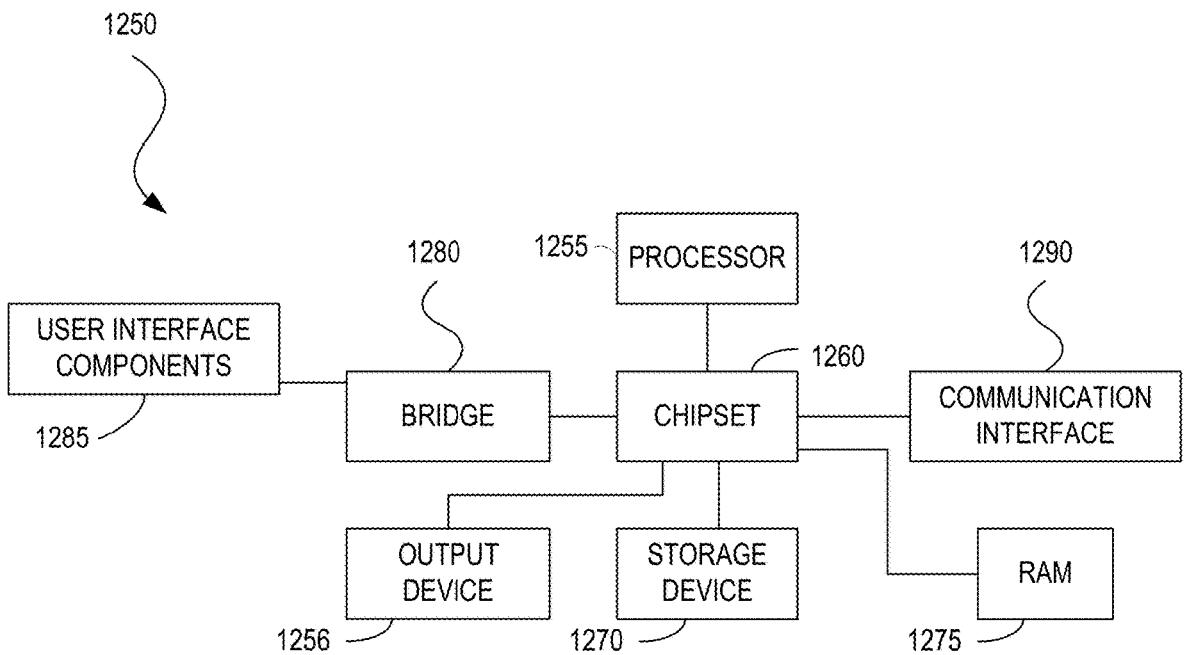

FIGS. 12A and 12B illustrate systems, according aspects of the present disclosure, that may be used to practice various aspects of the present disclosure. The appropriate system will be apparent to those of ordinary skill in the art when practicing the various embodiments. Similarly, persons of ordinary skill in the art will also readily appreciate that other systems are possible. FIG. 12A illustrates an example of a bus computing system 1200 wherein the components of the system are in electrical communication with each other using a bus 1205. The computing system 1200 can include a processing unit (CPU or processor) 1210 and a system bus 1205 that may couple various system components including the system memory 1215, such as read only memory (ROM) 1220 and random access memory (RAM) 1225, to the processor 1210. The computing system 1200 can include a cache 1212 of high-speed memory connected directly with, in close proximity to, or integrated as part of the processor 1210. The computing system 1200 can copy data from the memory 1215, ROM 1220, RAM 1225, and/or storage device 1230 to the cache 1212 for quick access by the processor 1210. In this way, the cache 1212 can provide a performance boost that avoids processor delays while waiting for data. These and other modules can control the processor 1210 to perform various actions. Other system memory 1215 may be available for use as well. The memory 1215 can include multiple different types of memory with different performance characteristics. The processor 1210 can include any general purpose processor and a hardware module or software module, such as services (SVC) 1 1232, SVC 2 1234, and SVC 3 1236 stored in the storage device 1230, configured to control the processor 1210 as well as a special-purpose processor where software instructions are incorporated into the actual processor design. The processor 1210 may essentially be a completely self-contained computing system, containing multiple cores or processors, a bus, memory controller, cache, etc. A multi-core processor may be symmetric or asymmetric.

To enable user interaction with the computing system 1200, an input device 1245 can represent any number of input mechanisms, such as a microphone for speech, a touch-protected screen for gesture or graphical input, keyboard, mouse, motion input, speech and so forth. An output device 1235 can also be one or more of a number of output mechanisms known to those of skill in the art. In some instances, multimodal systems can enable a user to provide multiple types of input to communicate with the computing system 1200. The communications interface 1240 can govern and manage the user input and system output. There may be no restriction on operating on any particular hardware arrangement and therefore the basic features here may easily be substituted for improved hardware or firmware arrangements as they are developed.

The storage device 1230 can be a non-volatile memory and can be a hard disk or other types of computer readable media which can store data that are accessible by a computer, such as magnetic cassettes, flash memory cards, solid state memory devices, digital versatile disks, cartridges, random access memory, read only memory, and hybrids thereof.

As discussed above, the storage device 1230 can include the software SVCs 1232, 1234, 1236 for controlling the processor 1210. Other hardware or software modules are contemplated. The storage device 1230 can be connected to the system bus 1205. In some embodiments, a hardware module that performs a particular function can include a software component stored in a computer-readable medium in connection with the necessary hardware components, such as the processor 1210, bus 1205, output device 1235, and so forth, to carry out the function.

FIG. 12B illustrates an example architecture for a chipset computing system 1250 that can be used in accordance with an embodiment. The computing system 1250 can include a processor 1255, representative of any number of physically and/or logically distinct resources capable of executing software, firmware, and hardware configured to perform identified computations. The processor 1255 can communicate with a chipset 1260 that can control input to and output from the processor 1255. In this example, the chipset 1260 can output information to an output device 1265, such as a display, and can read and write information to storage device 1270, which can include magnetic media, solid state media, and other suitable storage media. The chipset 1260 can also read data from and write data to RAM 1275. A bridge 1280 for interfacing with a variety of user interface components 1285 can be provided for interfacing with the chipset 1260. The user interface components 1285 can include a keyboard, a microphone, touch detection and processing circuitry, a pointing device, such as a mouse, and so on. Inputs to the computing system 1250 can come from any of a variety of sources, machine generated and/or human generated.

The chipset 1260 can also interface with one or more communication interfaces 1290 that can have different physical interfaces. The communication interfaces 1290 can include interfaces for wired and wireless LANs, for broadband wireless networks, as well as personal area networks. Some applications of the methods for generating, displaying, and using the technology disclosed herein can include receiving ordered datasets over the physical interface or be generated by the machine itself by the processor 1255 analyzing data stored in the storage device 1270 or the RAM 1275. Further, the computing system 1250 can receive inputs from a user via the user interface components 1285 and execute appropriate functions, such as browsing functions by interpreting these inputs using the processor 1255.

It will be appreciated that computing systems 1200 and 1250 can have more than one processor 1210 and 1255, respectively, or be part of a group or cluster of computing devices networked together to provide greater processing capability.

For clarity of explanation, in some instances the various embodiments may be presented as including individual functional blocks including functional blocks comprising devices, device components, steps or routines in a method embodied in software, or combinations of hardware and software.

Claim language reciting "at least one of" refers to at least one of a set and indicates that one member of the set or multiple members of the set satisfy the claim. For example, claim language reciting "at least one of A and B" means A, B, or A and B.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware, and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments.

Reference to "one embodiment" or "an embodiment" or similar terms means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

I claim:

1. A method of managing charging an electrochemical device comprising:
   transforming, using a processor, a waveform from the time domain to a frequency domain to identify a plurality of harmonic components of the waveform;
   altering a harmonic component of the plurality of harmonic components of the waveform transformed to the frequency domain;
   transforming the altered waveform to the time domain to generate a harmonically tuned charging waveform including the altered harmonic component; and
   applying the harmonically tuned charging waveform to the electrochemical device to charge the electrochemical device.

2. The method of claim 1 wherein transforming the waveform from the time domain to the frequency domain comprises a transformation from a time domain representation of the waveform to a frequency domain representation of the waveform, the frequency domain representation of the waveform further comprising a magnitude associated with the harmonic component.

3. The method of claim 2 wherein altering the harmonic component comprises altering the magnitude associated with the harmonic component.

4. The method of claim 1 further comprising identifying an impedance at the electrochemical device of the harmonic component and wherein the altering the harmonic component of the plurality of harmonic components is based on the identified impedance of the harmonic component.

5. The method of claim 4 wherein the harmonically tuned charging waveform is used to charge the electrochemical device with less impedance as compared to the waveform.

6. The method of claim 1 wherein the waveform is a portion of the waveform within a time boundary.

7. The method of claim 6, further comprising:
establishing an upper time boundary and a lower time boundary of the time boundary defining a first portion of the waveform; and
obtaining transformed frequency domain data of the portion of the waveform.

8. The method of claim 7, further comprising:
establishing a second upper time boundary and a second lower time boundary of a second portion of the waveform, the second portion of the waveform occurring after the first portion of the waveform; and
obtaining transformed frequency domain data of the second portion of the waveform.

9. The method of claim 8, further comprising:
combining the data of the first portion of the waveform and the data of the second portion of the waveform on a timeline associated with the waveform.

10. The method of claim 1 wherein the harmonic of the plurality of harmonics of the waveform has a high impedance of the electrochemical device and altering the harmonic component comprises suppressing the harmonic component.

11. The method of claim 1 wherein the harmonic of the plurality of harmonics of the waveform has a low impedance of the electrochemical device and altering the harmonic component comprises enhancing the harmonic component.

12. The method of claim 2 wherein transforming the waveform from a time domain to a frequency domain comprises utilizing a transform with a basis function based on the stationary and periodic nature of the waveform.

13. A method of charging an electrochemical device comprising:
applying, to a waveform associated with an electrochemical device, a wavelet frequency transform to transform the waveform to the frequency domain including a harmonic component of the waveform;
identifying an effect of the harmonic component;
altering, based on the identified effect, the harmonic component of the waveform;
transforming the waveform including the altered harmonic component to the time domain to generate a harmonically tuned charging waveform including the altered harmonic component; and
applying the harmonically tuned charging waveform to the electrochemical device to charge the electrochemical device.

14. The method of claim 13 wherein the waveform is a charge signal for energy transfer to the electrochemical device.

15. The method of claim 13 wherein the effect of the identified component is impedance.

16. The method of claim 13 wherein altering the harmonic component comprises enhancing the harmonic component or suppressing the harmonic component.

17. The method of claim 13, further comprising:
identifying, based on the frequency domain of the waveform, a characteristic of the electrochemical device.

18. The method of claim 17 wherein the characteristic of the electrochemical device is associated with a charge rate of the electrochemical device.

* * * * *